(12) United States Patent
Fazan

(10) Patent No.: US 8,518,774 B2
(45) Date of Patent: Aug. 27, 2013

(54) MANUFACTURING PROCESS FOR ZERO-CAPACITOR RANDOM ACCESS MEMORY CIRCUITS

(75) Inventor: Pierre Fazan, Lonay (CH)

(73) Assignee: Micron Technology, Inc., Boise, ID (US)

( * ) Notice: Subject to any disclaimer, the term of this patent is extended or adjusted under 35 U.S.C. 154(b) by 259 days.

(21) Appl. No.: 12/053,398

(22) Filed: Mar. 21, 2008

(65) Prior Publication Data

US 2008/0237714 A1    Oct. 2, 2008

Related U.S. Application Data

(60) Provisional application No. 60/921,151, filed on Mar. 29, 2007.

(51) Int. Cl.
*H01L 29/06* (2006.01)
(52) U.S. Cl.
USPC ............... 438/257; 257/E21.646; 438/296; 438/905; 438/68
(58) Field of Classification Search
None
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |
| 4,658,377 A | 4/1987 | McElroy | |
| 4,791,610 A | 12/1988 | Takemae | |
| 4,807,195 A | 2/1989 | Busch et al. | |

(Continued)

FOREIGN PATENT DOCUMENTS

| | | |
|---|---|---|
| CA | 272437 | 7/1927 |
| EP | 0 030 856 | 6/1981 |

(Continued)

OTHER PUBLICATIONS

Hoon Jeong et al, A New capacitorless 1T DRAM Cell; Surrounding Gate MOSFET with vertical channel, IEEE, May 2007.*

(Continued)

*Primary Examiner* — Julio J Maldonado
*Assistant Examiner* — Mohammad Choudhry
(74) *Attorney, Agent, or Firm* — Wilmer Cutler Pickering Hale and Dorr LLP

(57) ABSTRACT

Embodiments of a manufacturing process flow for producing standalone memory devices that can achieve bit cell sizes on the order of 4F2 or 5F2, and that can be applied to common source/drain, separate source/drain, or common source only or common drain only transistor arrays. Active area and word line patterns are formed as perpendicularly-arranged straight lines on a Silicon-on-Insulator substrate. The intersections of the active area and spaces between word lines define contact areas for the connection of vias and metal line layers. Insulative spacers are used to provide an etch mask pattern that allows the selective etching of contact areas as a series of linear trenches, thus facilitating straight line lithography techniques. Embodiments of the manufacturing process remove first layer metal (metal-1) islands and form elongated vias, in a succession of processing steps to build dense memory arrays.

22 Claims, 18 Drawing Sheets

(56) References Cited

U.S. PATENT DOCUMENTS

| | | |
|---|---|---|
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidaka et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 * | 8/2002 | Fukuda et al. ................ 438/244 |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 * | 5/2006 | Chang et al. ................ 438/275 |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 * | 8/2006 | Ferrant et al. ................ 365/149 |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |

| | | |
|---|---|---|
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2* | 4/2009 | Mathew et al. ............... 438/176 |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1* | 8/2002 | Iwata et al. ............... 365/185.23 |
| 2002/0130341 A1 | 9/2002 | Horiguchi et al. |
| 2002/0158281 A1* | 10/2002 | Goldbach et al. ............. 257/296 |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1* | 5/2008 | Burnett et al. ............. 257/295 |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |

| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| HK | H04-176163 A | 6/1922 |
| JO | H08-213624 A | 8/1996 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Jeong et al, Capacitorless DRAM cell with Highly Scalable surrounding Gate Structure, Sep. 2006, International Conference on Solid State Devices and Materials.*
Arimoto et al., A Configurable Enhanced T2RAM Macro for System-Level Power Management Unified Memory, 2006, VLSI Symposium.
Arimoto, A High-Density Scalable Twin Transistor RAM (TTRAM) With Verify Control for SOI Platform Memory IPs, Nov. 2007, Solid-State Circuits.
Asian Technology Information Program (ATIP) Scoops™, "Novel Capacitorless 1T-DRAM From Single-Gate PD-SOI to Double-Gate FinDRAM", May 9, 2005, 9 pages.
Assaderaghi et al., "A Dynamic Threshold Voltage MOSFET (DTMOS) for Ultra-Low Voltage Operation", IEEE IEDM, 1994, pp. 809-812.
Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.
Assaderaghi et al., "A Novel Silicon-On-Insulator (SOI) MOSFET for Ultra Low Voltage Operation", 1994 IEEE Symposium on Low Power Electronics, pp. 58-59.
Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.
Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.
Avci, Floating Body Cell (FBC) Memory for 16-nm Technology with Low Variation on Thin Silicon and 10-nm BOX, Oct. 2008, SOI Conference.
Bae, Evaluation of 1T RAM using Various Operation Methods with SOONO (Silicon-On-ONO) device, Dec. 2008, IEDM.
Ban, A Scaled Floating Body Cell (FBC) Memory with High-k+Metal Gate on Thin-Silicon and Thin-BOX for 16-nm Technology Node and Beyond, Jun. 2008, VLSI Symposium.
Ban, Ibrahim, et al., "Floating Body Cell with Independently-Controlled Double Gates for High Density Memory," Electron Devices Meeting, 2006. IEDM '06. International, IEEE, Dec. 11-13, 2006.
Bawedin, Maryline, et al., A Capacitorless 1T Dram on SOI Based on Dynamic Coupling and Double-Gate Operation, IEEE Electron Device Letters, vol. 29, No. 7, Jul. 2008.
Blagojevic et al., Capacitorless 1T DRAM Sensing Scheme Automatice Reference Generation, 2006, IEEE J.Solid State Circuits.
Blalock, T., "A High-Speed Clamped Bit-Line Current-Mode Sense Amplifier", IEEE Journal of Solid-State Circuits, vol. 26, No. 4, Apr. 1991, pp. 542-548.
Butt, Scaling Limits of Double Gate and Surround Gate Z-RAM Cells, 2007, IEEE Trans. On El. Dev.
Chan et al., "Effects of Floating Body on Double Polysilicon Partially Depleted SOI Nonvolatile Memory Cell", IEEE Electron Device Letters, vol. 24, No. 2, Feb. 2003, pp. 75-77.
Chan, et al., "SOI MOSFET Design for All-Dimensional Scaling with Short Channel, Narrow Width and Ultra-thin Films", IEEE IEDM, 1995, pp. 631-634.
Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009.
Cho, A novel capacitor-less DRAM cell using Thin Capacitively-Coupled Thyristor (TCCT), 2005, IEDM.
Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multifunctional SoC Applications, Dec. 2008, IEDM.
Clarke, Junctionless Transistors Could Simply Chip Making, Say Researchers, EE Times, Feb. 2010, www.eetimes.com/showArticle. jhtml?articleID=223100050.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.

Fazan et al., "A Simple 1-Transistor Capacitor-Less Memory Cell for High Performance Embedded DRAMs", IEEE 2002 Custom Integrated Circuits, Jun. 2002, pp. 99-102.
Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, SAME.
Fisch, Z-RAM® Ultra-Dense Memory for 90nm and Below, 2006, Hot Chips.
Fossum et al., New Insights on Capacitorless Floating Body DRAM Cells, 2007, IEEE EDL.
Fujita, Array Architectureof Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices.
Han et al., Bulk FinFET Unified-RAM (URAM) Cell for Multifunctioning NVM and Capacitorless 1T-DRAM, 2008, IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-RAM (URAM) for Multi-Functioning 1T-DRAM and NVM, Dec. 2008, IEDM.
Han, Parasitic BJT Read Method for High-Performance Capacitorless 1T-DRAM Mode in Unified RAM, Oct. 2009, IEEE EDL.
Hara, Y., "Toshiba's DRAM Cell Piggybacks on SOI Wafer", EE Times, Jun. 2003.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI.
Jeong et al., "A Capacitor-less 1T DRAM Cell Based on a Surrounding Gate MOSFET with Vertical Channel", Technology Development Team, Technology Development Team, Samsung Electronics Co., Ltd., May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-139.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub 100 nm Embedded and Stand Alone Memory Applications, 2003, IEEE Trans. On El. Dev.
Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).
Lee et al., "A Novel Pattern Transfer Process for Bonded SOI Giga-bit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI FLASH Memory Cell", IEEE, Mar. 2000, pp. 12-15.
Liu et al., Surface Generation-Recombination Processes of Gate and STI Oxide Interfaces Responsible For Junction Leakage on SOI, Sep. 2009, ECS Transactions, vol. 25.
Liu, Surface Recombination-Generation Processes of Gate, STI and Buried Oxide Interfaces Responsible for Junction Leakage on SOI, May 2009, ICSI.
Lončar et al., "One of Application of SOI Memory Cell—Memory Array", IEEE Proc. 22nd International Conference on Microelectronics (MIEL 2000), vol. 2, Niš, Serbia, May 14-17, 2000, pp. 455-458.
Lu et al., A Novel Two-Transistor Floating Body/Gate Cell for Low Power Nanoscale Embedded DRAM, 2008, IEEE Trans. On El. Dev.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005, VLSI Circuits.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of 6F2 Single Cell Operation in Multi Gbit Memories Confirmed by a Newly Developed Method for Measuring Signal Sense Margin, 2007, IEDM.
Minami, A Floating Body Cell (FBC) fully Compatible with 90nm CMOS Technology(CMOS IV) for 128Mb SOI DRAM, 2005, IEDM.
Mohapatra et al., Effect of Source/Drain Asymmetry on the Performance of Z-RAMÒ Devices, Oct. 2009, SOI conference.
Morishita, A Capacitorless Twin-Transistor Random Access Memory (TTRAM) on SOI, 2005, CICC.
Morishita, F. et al., "A Configurable Enhanced TTRAM Macro for System-Level Power Management Unified Memory", IEEE Journal of Solid-State Circuits, vol. 42, No. 4, pp. 853, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying of Hot Carrier Effect In Floating Body Soi Mosfets by the Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562μm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM, (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less Dram Memory, SOI Conference, 2009 IEEE International, Oct. 5-8, 2009 pp. 1-2.

Roy, Thyristor-Based Volatile Memory in Nano-Scale CMOS, 2006, ISSCC.

Salling et al., Reliability of Thyristor Based Memory Cells, 2009, IRPS.

Sasaki et al., Charge Pumping in SOS-MOS Transistors, 1981, IEEE Trans. On El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. On El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

International Search Report mailed Jun. 26, 2009 for International Patent Application No. PCT/IB2008/003284.

Tanabe et al., A 30-ns. 64-MB DRAM with Built-in-Self-Test and Self-Repair Function, IEEE Journal of Solid State Circuits, vol. 27, No. 11, pp. 1525-1533, Nov. 1992.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

* cited by examiner

150

MANUFACTURING PROCESS FOR ZERO-CAPACITOR RANDOM ACCESS MEMORY CIRCUITS

CROSS-REFERENCE TO RELATED APPLICATIONS

The present application claims the benefit of the U.S. Provisional Application Ser. No. 60/921,151 entitled "Manufacturing Process for Zero-Capacitor Random Access Memory Circuits" and filed on Mar. 29, 2007, which is hereby incorporated by reference in its entirety.

FIELD

Embodiments of the invention relate generally to semiconductor manufacturing, and more specifically to manufacturing processes for memory cell circuits.

BACKGROUND

Many modern microprocessors incorporate significant amounts of on-chip memory (such as cache memory), and the present trend toward ever-increasing amounts of on-chip memory have led some industry analysts to forecast that up to 90% of the die area of future processors will be occupied by memory. Different types of memory devices are presently used for the various cache and on-board memory arrays. For example, L1 (Level 1) caches typically use SRAM (Static Random Access Memory) devices, while other caches may use eDRAM (Embedded Dynamic Random Access Memory). Still other memory arrays may use Flash memory, or similar devices. Each type of memory has certain performance, storage, power consumption, and cost characteristics that may be well-suited to one type of application, but not others. These different types of memory devices also often have different device geometries, and are fabricated by different manufacturing processes. For example, SRAM bit-cells require four to six transistors, and are thus relatively costly, but they scale readily to smaller fabrication processes. Flash memory has fewer transistors, but is relatively slow, while DRAM has only one transistor per bit-cell and is relatively fast. Because of size and performance characteristics, DRAM is a popular choice for wide-scale use as stand alone memory, however, these devices also require the use of a capacitor per bit-cell, and the deep trench or stacked structure required for the capacitor produces an aspect ratio that does not scale well to smaller fabrication processes (e.g., beyond 65 nm).

FIG. 1A illustrates an example of a standard DRAM cell with a trench capacitor structure. In FIG. 1A, the DRAM cell 100 comprises a transistor which has a gate 102 that is separated from the substrate 106 by a gate oxide layer 105. Source and drain junctions 104 are formed within silicon substrate 106. The DRAM cell 100 also includes a trench capacitor 110, which extends downward through substrate 106. The capacitor structure 110 can also be a stacked capacitor, which case it would protrude upwards from substrate 106. Although trench technology may provide favorable topographies above the silicon surface, it presents significant challenges below the transistor, and can produce an aspect ratio as large as 90 to 1. This limitation prevents current DRAM devices from exploiting production processes that are much smaller than the current 65 nm or 45 nm technologies. The capacitor structure also imposes significant cost and yield constraints on DRAM manufacturing processes.

One important parameter associated with transistor circuits, such as DRAMs is the feature size of the device. In general, the feature size of the transistor is denoted F, where F corresponds to the minimum gate length that can be produced in the manufacturing process for circuit 100. Thus, for the example circuit of FIG. 1A, the width of gate 102 would define the feature size, F, for circuit 100. Under present manufacturing systems, the bit-cell area for a one-transistor, one-capacitor DRAM device is typically on the order of 2F by 4F, which equals $8F^2$.

To overcome the fabrication disadvantages of traditional DRAM devices, a new DRAM technology for memory applications has been developed. This technology, referred to as "Z-RAM" consists of a single transistor per bit-cell, with zero capacitors, thus eliminating the deep trench or the complex stacked capacitor. Z-RAM® was developed by, and is a trademark of Innovative Silicon, Inc. of Switzerland. Z-RAM is built on Silicon-on-Insulator (SOI) wafers, and was initially developed for embedded memory applications. In general, various different manufacturing processes can be employed to produce Z-RAM devices. It is desirable to implement a manufacturing process that reduces the size of the memory bit cell, thereby increasing the density of memory cells beyond the current $8F^2$ DRAM density, and also extends Z-RAM manufacturing processes to standalone memory applications. It is further desirable to provide a manufacturing process that allows DRAM device technology to scale below current manufacturing feature size dimensions, such as 45 nm and below.

It is yet further desirable to utilize a manufacturing process flow for Z-RAM devices that does not affect or alter drastically existing process flows for stand alone memory production for applications in which Z-RAM is used as on-chip memory or other stand alone memory applications.

Disadvantages with present memory cell fabrication processes also extend to the layout of signal lines through arrays of memory cells. FIG. 1B illustrates the bit and word line routing in present capacitor-based DRAM arrays 150. As shown in FIG. 1B, in typical prior art semiconductor lithography systems, DRAM active areas 152 are formed as long rectangular areas that are separated by gaps and staggered from row to row. The active areas 152 comprise the source, drain and gates of the memory transistors, and are parallel to the bit lines 153 of the memory cells. The word lines 162 are polysilicon lines that intersect the active areas 152 to form the transistor gates. The polysilicon gates for the word lines 162 are separated from the active areas at the intersection by a gate oxide layer. The cell layout of FIG. 1B also illustrates capacitor contacts 163 and bit line contact 165. The bit cell area is illustrated by box 154. As shown in array 150, the routing word lines consist of straight line segments and angled segments 164. Such a routing scheme facilitates the staggered layout of the active areas, but imposes a complication on the lithography process through the requirement of relatively complicated line layouts. Such complications impose practical limits on the degree of scalability of present memory array designs.

BRIEF DESCRIPTION OF THE DRAWINGS

Embodiments of the present invention are illustrated by way of example and not limitation in the figures of the accompanying drawings, in which like references indicate similar elements and in which.

DETAILED DESCRIPTION

Embodiments of a manufacturing process flow for producing standalone Z-RAM devices that can achieve bit cell sizes on the order of 4F2 or 5F2, and that can be applied to common gate, common source, common drain, or separate source or drain transistors, are described.

Active area and poly line patterns are formed as perpendicularly-arranged straight lines (for common source/drain transistors), or rectangular areas on a Silicon-on-Insulator substrate. The intersections of the active area and word lines define contact areas for the connection of vias and metal line layers. Insulative spacers are used to provide an etch mask pattern that allows the selective etching of contact areas as a series of linear trenches, thus facilitating straight line lithography techniques. Embodiments of the manufacturing process remove first layer metal (metal-1) islands and form elongated vias, in a succession of processing steps to build a dense stand-alone Z-RAM array or embedded DRAM arrays.

In the following description, numerous specific details are introduced to provide a thorough understanding of, and enabling description for, embodiments of a dense memory cell manufacturing process. One skilled in the relevant art, however, will recognize that these embodiments can be practiced without one or more of the specific details, or with other components, systems, and so on. In other instances, well-known structures or operations are not shown, or are not described in detail, to avoid obscuring aspects of the disclosed embodiments.

Figure 1A:
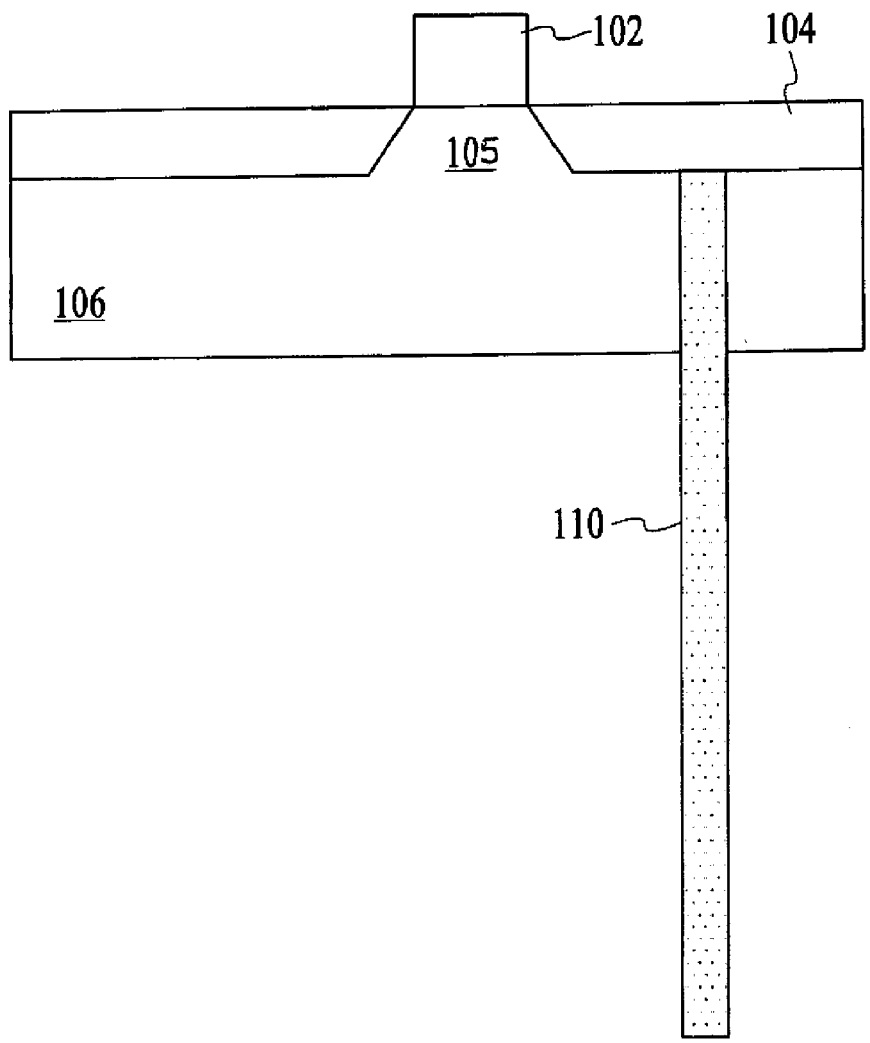
FIG. 1A illustrates an example of a standard DRAM cell with a trench capacitor structure.
Figure 1B:
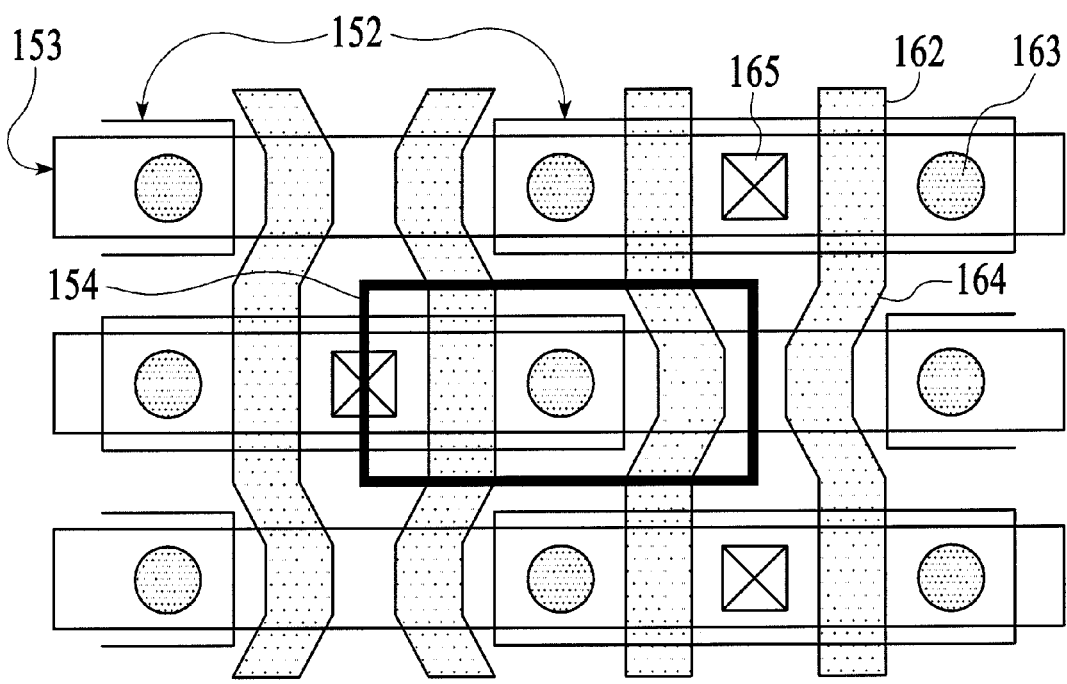
FIG. 1B illustrates the bit and word line routing in present capacitor-based DRAM arrays.
Figure 2:
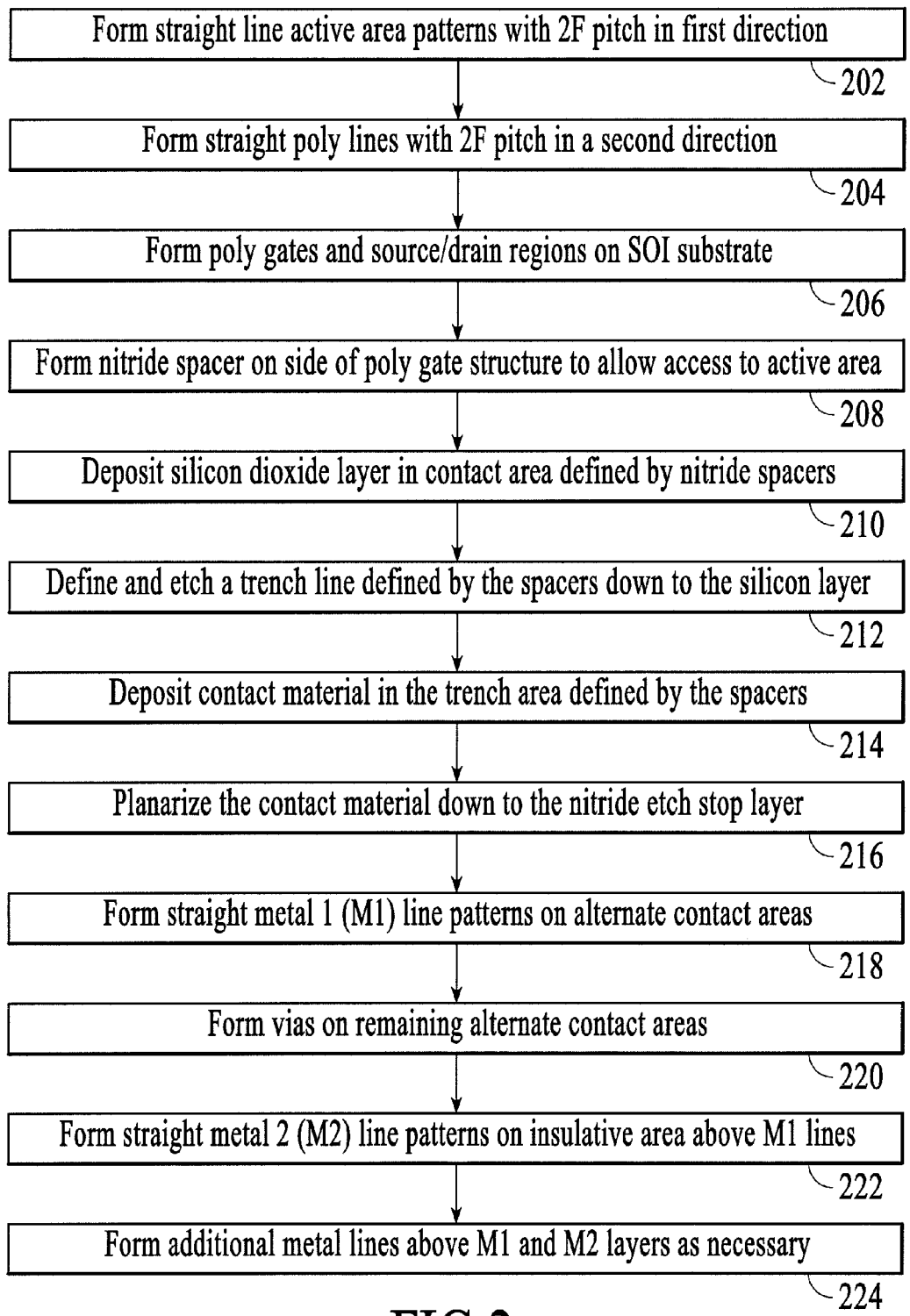
FIG. 2 is a flowchart that illustrates a process flow for manufacture of Z-RAM memory arrays, under an embodiment.

As shown in FIG. 1B, in typical prior art semiconductor lithography systems, DRAM active areas are formed as small rectangular areas that are staggered from row to row. Word lines running over the active areas require bends or turns in the traces to maintain isolation of individual active area cells. Embodiments of present manufacturing system and method employ straight line patterning of active areas, thus facilitating the use of manufacturing process that can be scaled to smaller feature sizes. FIG. 2 is a flowchart that illustrates a process flow for manufacture of Z-RAM memory arrays, under an embodiment. In general, a number of memory devices will be formed in an array that is produced by successive steps of patterning conductive and insulative layers in a grid pattern, and selectively etching these layers to produce the devices (bit cells). In general, each bit cell is built from an active layer that is patterned in straight lines. With reference to FIG. 2, the process starts in block 202, in which the straight line active area patterns are formed by the shallow trench isolation (STI) process known in the art. The active areas are formed as a series of lines or rectangles in a first direction (e.g., horizontally) on the substrate surface. The use of straight lines greatly facilitates these lithography processes and allows scaling to smaller process dimensions defined by the feature size, F.

In one embodiment, Silicon-on-Insulator (SOI) technology is used to make a simpler transistor structure that does not require a capacitor. In general, SOI was developed as an alternative to conventional CMOS (Complementary Metal Oxide Semiconductor) technology to provide improved processing performance and reduced current leakage. Unlike conventional CMOS chips, where a transistor is placed directly on the surface of a silicon substrate, an SOI device has a thick layer of oxide insulator (typically silicon dioxide) between the transistor and the silicon substrate to more efficiently isolate transistors from adjacent devices and from the substrate. On SOI wafers, there is a buried oxide layer that covers the complete surface of the wafer.

Figure 3:
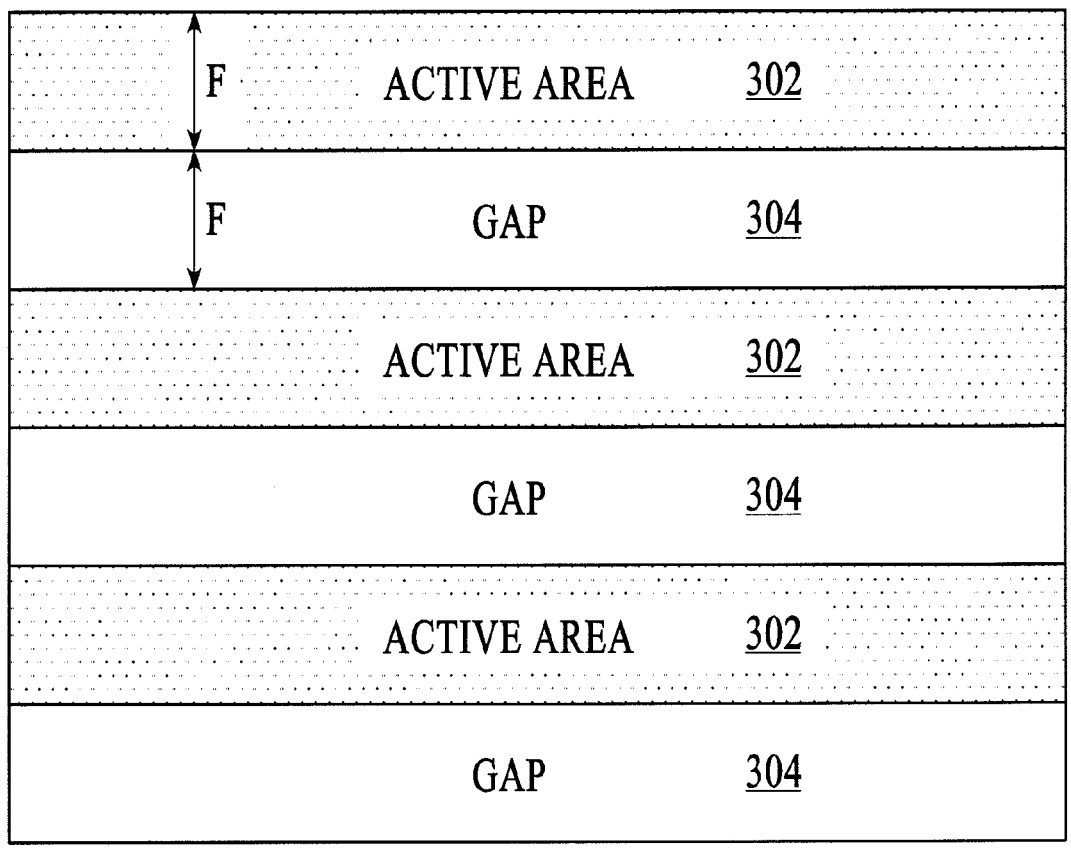
FIG. 3 is a top view illustration of straight line active area patterns formed on a substrate, under an embodiment.

FIG. 3 is a top view illustration of straight line active area patterns formed on an SOI substrate, under an embodiment. As shown in FIG. 3, the active area lines 302 are formed as straight lines or rectangles in a horizontal (first) direction with a critical dimension of width F, and this defines the minimum size of the device formed by the active area. In one embodiment, the gap 304 or distance between the active area patterns is also F, so that the pattern pitch is 2F. Alternatively, the width 302 and the distance between the active area lines 304 can vary from F to any multiple of F depending on the constraints and requirements of the system.

Figure 4:
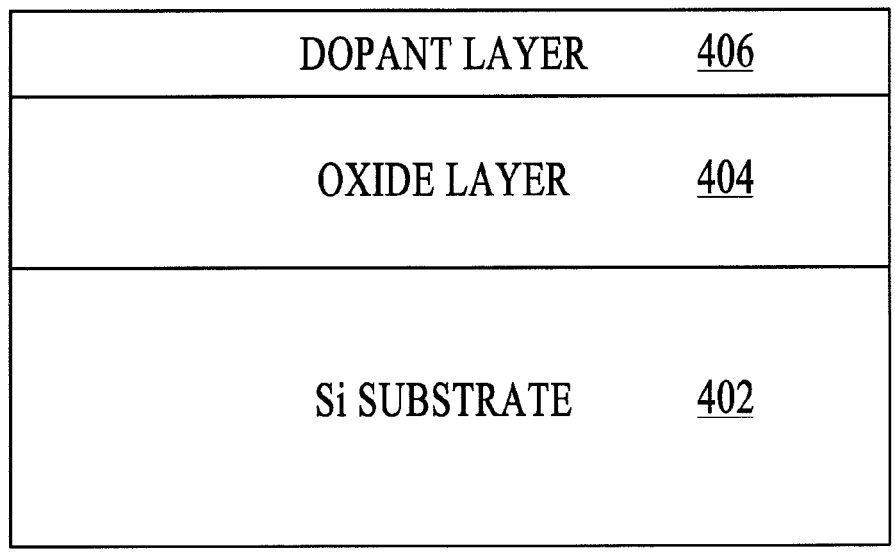
FIG. 4 is a side view illustration of an active area pattern such as illustrated in FIG. 3, under an embodiment.

FIG. 4 is a side view illustration of an active area pattern on an SOI substrate, such as illustrated in FIG. 3, under an embodiment. As shown in FIG. 4, an oxide layer 404 is formed on top of a substrate layer 402, which is typically a silicon (Si) substrate. On top of oxide lies a doped silicon layer 406. This silicon layer is doped to the proper level depending on critical parameters of the device, or the requirements of any particular application. In one embodiment, the dopant implanted dose is on the order of $10^{12}$ to $10^{14}$ dopant atoms/cm$^2$. Layer 406 of FIG. 4 is a silicon layer that comprises the active layer in which the transistors will be formed. The gaps 304 of FIG. 3 are made by an STI process that removes layer 406 and replaces it with an oxide film so that adjacent active area are insulated. The STI process uses photolithography and etching techniques to define areas of active regions and areas of insulated regions. During this process, the silicon 406 in regions 304 is etched away and then an oxide is deposited in the holes and planarized by a planarization technique, such as CMP (Chemical Mechanical Planarization).

After the active area patterns are formed and the appropriate dopant atoms are introduced, known semiconductor fabrication steps are performed, such as the growth of gate oxide layers, and so on. In one embodiment, the gates of the circuit are formed by the patterning of straight conductive lines (word lines), in a direction perpendicular to the active area lines. Thus, with reference to FIG. 2, in block 204, a set of straight word lines is laid in a second direction (e.g., vertical) on the substrate. For an embodiment in which stand alone memory devices are fabricated, the word lines are made from a stack of three different materials: polysilicon, then a silicide material, then an insulator. These layers are typically polysilicon, tungsten silicide, and silicon nitride. In one embodiment, the word lines comprise poly/silicide/nitride traces that define the areas for self-aligned contacts.

Figure 5:
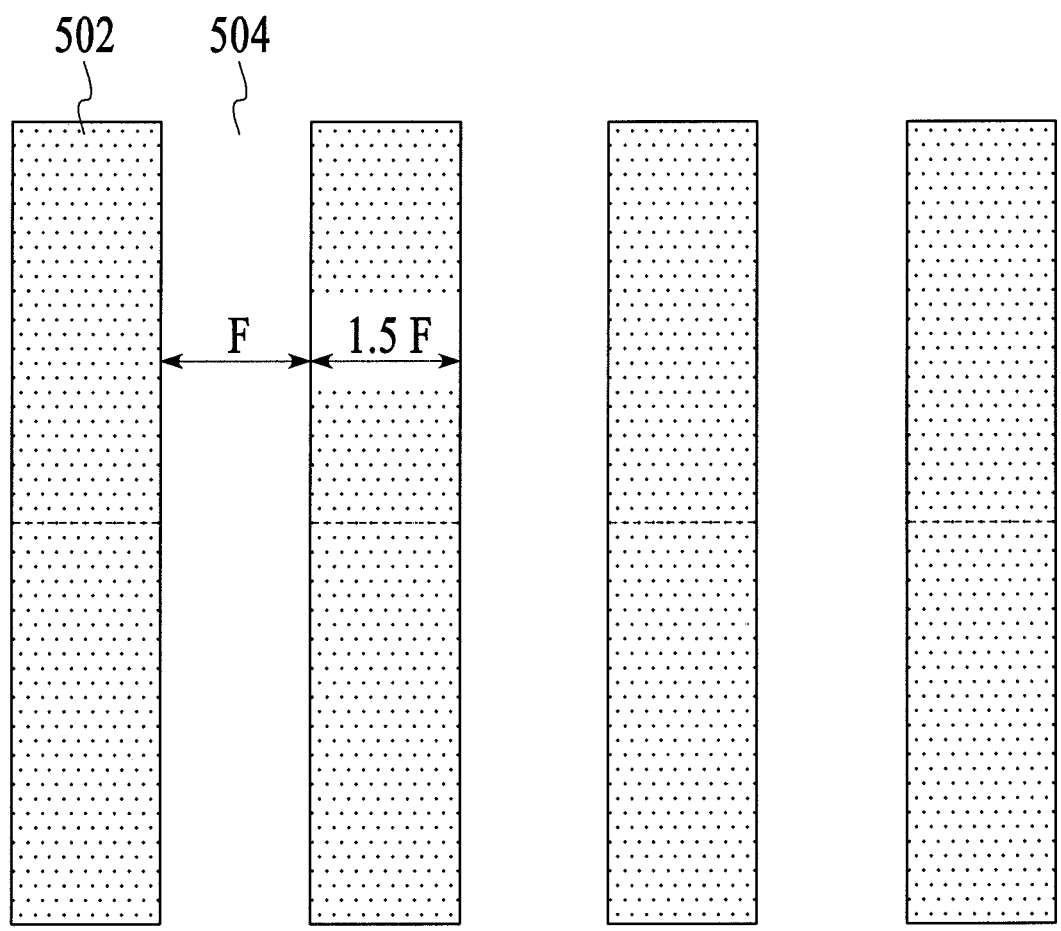
FIG. 5 is a top view illustration of straight poly line patterns formed on a substrate, under an embodiment.

FIG. 5 is a top view illustration of straight word line patterns formed on a substrate, under an embodiment. As shown in FIG. 5, the word lines 502 are formed as straight lines in a vertical (second) direction with a critical dimension of width 1.5F, and this defines a second dimension of the device formed by the active area 302 of FIG. 3. In one embodiment, the gap 504 or distance between the word line patterns is F, so that the pattern pitch for the word lines is 2.5F. Alternatively, the distance between the word lines 502 and 504 can be any multiple of F (e.g., 1.5F, 2F or 3F) depending on the constraints and requirements of the system.

Figure 6:
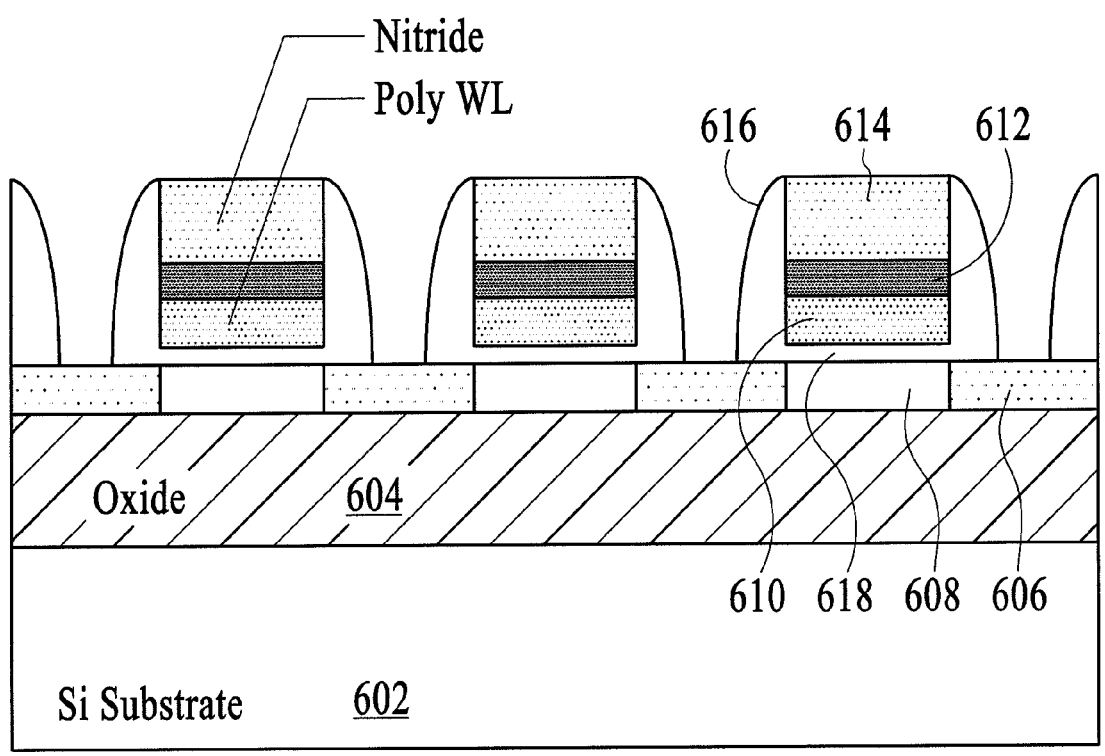
FIG. 6 is a side view illustration of a memory array produced by a fabrication process, under an embodiment.

FIG. 6 is a side view illustration of a memory array produced by a fabrication process, under an embodiment. As shown in FIG. 6, several layers 610, 612 and 614 forming the transistor device and the word lines are formed on the SOI substrate. A poly layer 610 is formed on top of a silicon substrate layer 602. The doped silicon layer 406 of FIG. 4 is patterned into separate contact and gap areas 606 and 608. A poly gate structure is created above this layer. In one embodiment, the poly gate comprises a polysilicon layer 610, a polycide layer 612, and an insulation layer 614. The structure comprising layers 610, 612, and 614 is alternatively referred to as a transistor or "poly gate." The polycide of layer 612 is typically a silicide material (e.g., tungsten silicide, WSi), and the insulation layer 614 can be silicon nitride ($Si_3N_4$), or any similar insulative compound. The poly gate is formed by depositing the three layers 610, 612, and 614 on the oxide layer through deposition techniques, photolithography techniques, and then dry etching the areas between the gates to form the appropriate gate pattern. After etching, Halo implants and (Lightly Doped Drain) LDD implants are used to dope the source and drain contact regions 606. The doping step forms a channel region 608 between the source and drain of the transistor.

In one embodiment, a silicon nitride (or similar insulative) spacer 616 is formed to define an area around the poly gate with respect to the source and drain areas 606. After the spacer formation step, the source and drain regions are further doped. The gap 618 between the polysilicon layer 610 and the 608 region is formed by the gate oxide layer that was grown in a previous processing step. The thickness of gap 618 can be adjusted to optimize the operation of the memory cell, and can range anywhere from 1-10 nm, and is typically 5 nm, and can be reduced down to 3 nm or 2 nm.

Figure 7:
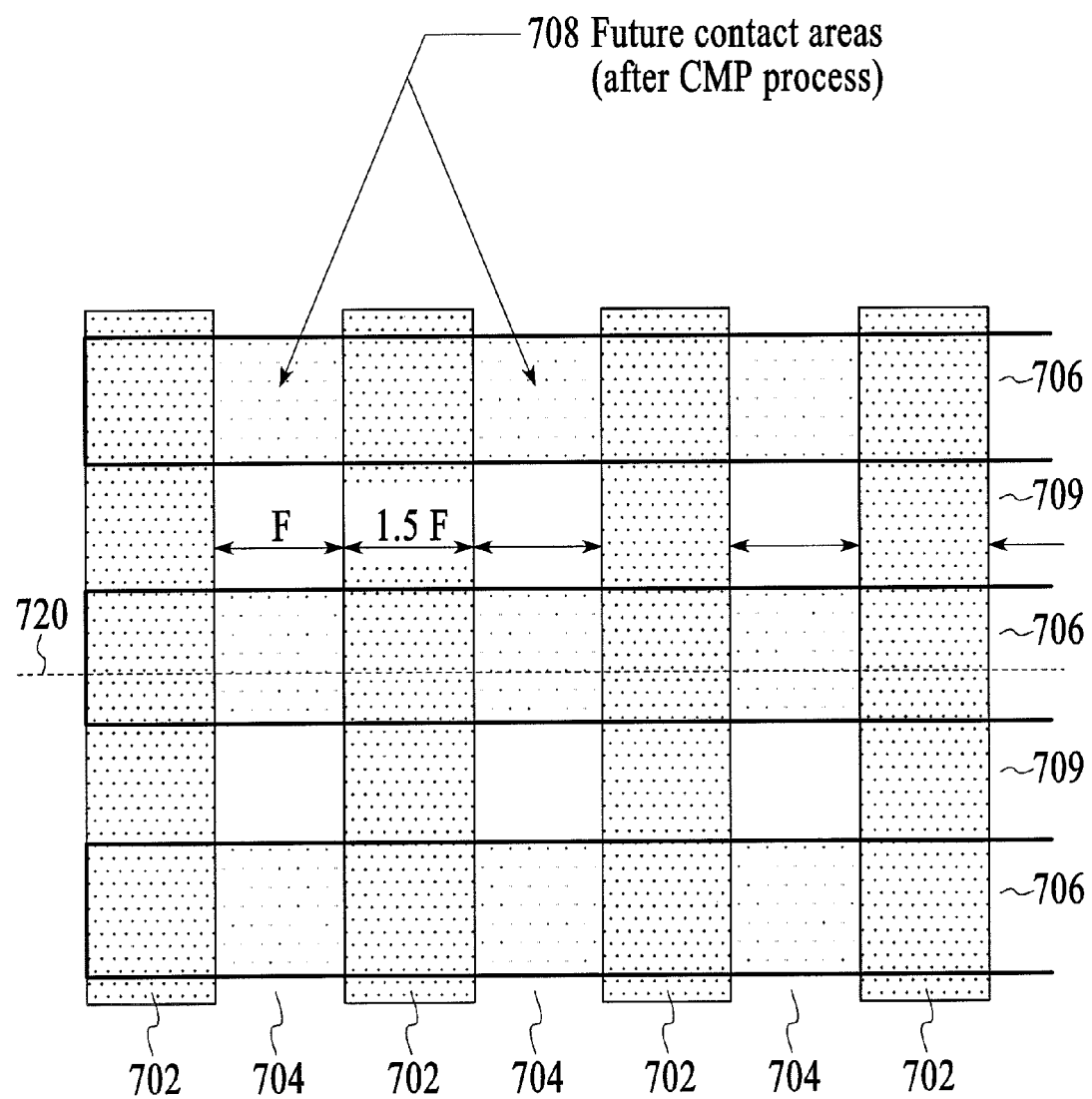
FIG. 7 illustrates the top view of an array of formation of contact areas for the gates of transistor devices, under an embodiment.

FIG. 6 illustrates the formation of three separate transistor devices comprising the gates and source/drain regions 606. This is illustrated in FIG. 2 as block 206. One of the ultimate goals of the process according to embodiments, is the formation of contact areas that contact the source/drain areas 606 to allow connection of wires to the transistor devices. In general, present lithography systems are well suited to producing lines, however, making square contacts is typically more difficult. Embodiments of the fabrication method produce square contacts using line and space patterning techniques. In this manner, regular contact and plug patterns are formed using line lithography (lines intersection) methods. The lack of a capacitor in memory cells, as shown in FIG. 1A, and produced in accordance with embodiments, allows the formation of contact areas through line lithography, as opposed to forming or drilling of individual holes, which is generally, a much more costly and complicated process. FIG. 7 illustrates a top view of an array of contact areas for the gates of transistor devices, under an embodiment. Alternating rows of active area rows 706 separated by gaps 709, and word line columns 702 and the gaps 704 between these columns define the areas of the contacts 708. In one embodiment, the contact areas are squares of dimension 1F by 1F that are formed at the intersection of the active areas 706 and the gaps 704 between the word lines 702. The contacts ultimately connect the metal lines and vias of the circuit to the active areas of the memory cells.

In general terms, the contact areas 708 are formed by patterning the lines 706, etching grooves in between the spacers, filling the grooves with polysilicon or metal and polishing the layer down to the nitride cap. The grooves essentially comprise trenches that are etched in straight lines through the poly layers, thus allowing for creation of contacts through line lithography, rather than traditional drilling techniques, thus making contact creation a more cost effective process. The trenches are defined by nitride spacers placed on the sides of the poly gates, as shown in block 208 of FIG. 2.

Figure 8:
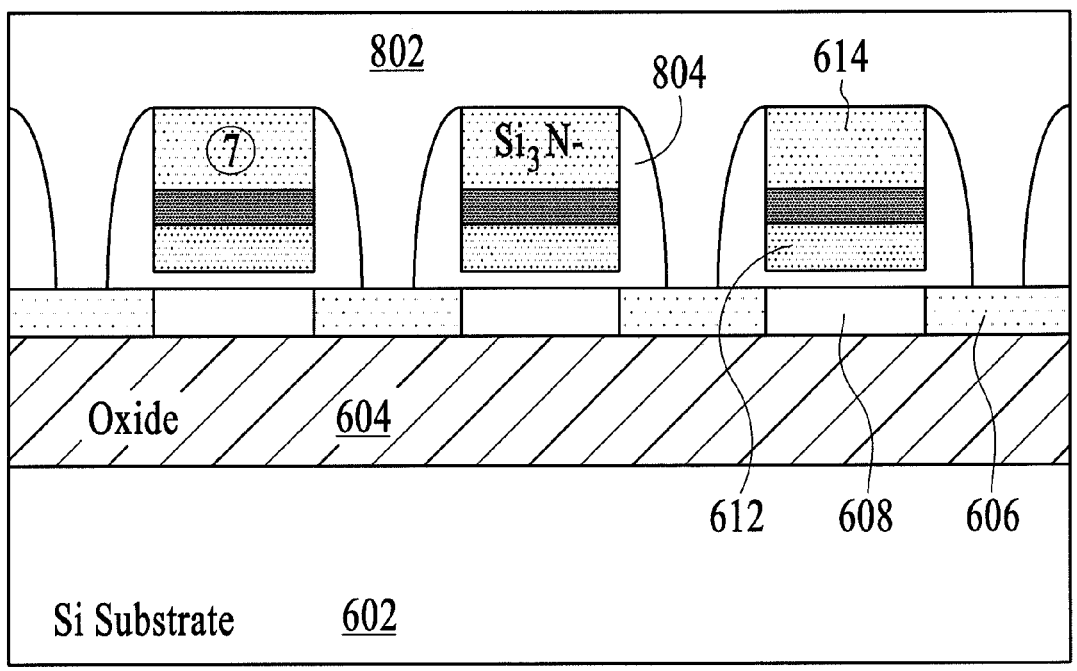
FIG. 8 is a side view illustration of a memory array as viewed from a cross-section line of FIG. 7, under an embodiment.

FIG. 8 is a side view illustration of a memory array as viewed from cross-section line 720 of FIG. 7, prior to patterning and etching, under an embodiment. As shown in FIG. 8, area 804 defines the spacer area and, in one embodiment, comprises silicon nitride ($Si_3N_4$), as does the insulative layer 614 of the poly gate. The area 802 between the spacers contacts the source/drain areas 606, and is filled with a dielectric material, such as silicon dioxide ($SiO_2$). Thus, for the process of FIG. 2, after the nitride spacers have been formed, the silicon dioxide layer is deposited and then polished to allow for straight line lithography on a planar surface, block 210. As shown in block 212 of FIG. 2, the elongated line defined by the spacers is etched using a selective etch process that removes the insulative material down to the silicon layer. The silicon nitride comprising the spacer region 804 and the film 614 on top of the conductive gate, act as an etch stop.

In one embodiment, silicon nitride and silicon dioxide are used as the spacer and insulative materials respectively, as shown in FIG. 8. Alternatively, any suitable materials that have high etch selectively may also be used, such as Tantalum Oxide ($Ta_2O_5$), Titanium Oxide ($TiO_2$), Zirconium Oxide ($ZrO_2$), Hafnium Oxide ($HfO_2$), Aluminum Oxide ($Al_2O_3$), and other such insulators or combinations of insulators. Any of these insulative materials can be used in regions 802, 804, or 614 of the poly gate structure shown in FIG. 8. In general, the spacer region 804 and the top layer of the poly gate 614 are made of the same material, and the gap region 802 is filled with a different insulative or dielectric material.

Figure 9:
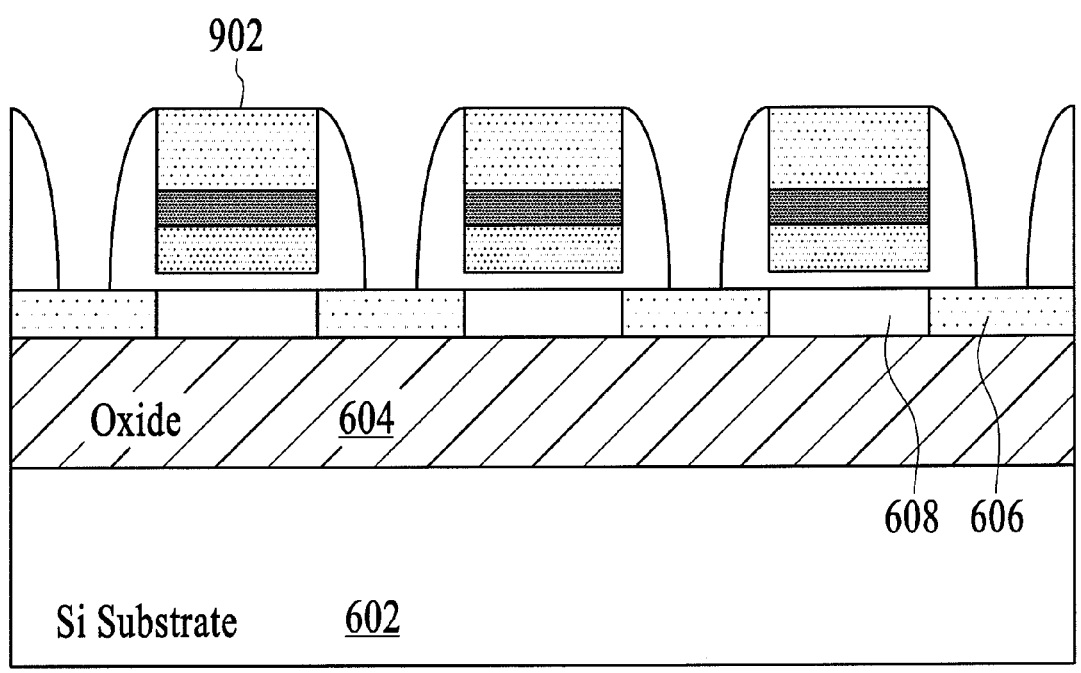
FIG. 9 is a side view illustration of a memory array after a trench etch process, under an embodiment.
Figure 10:
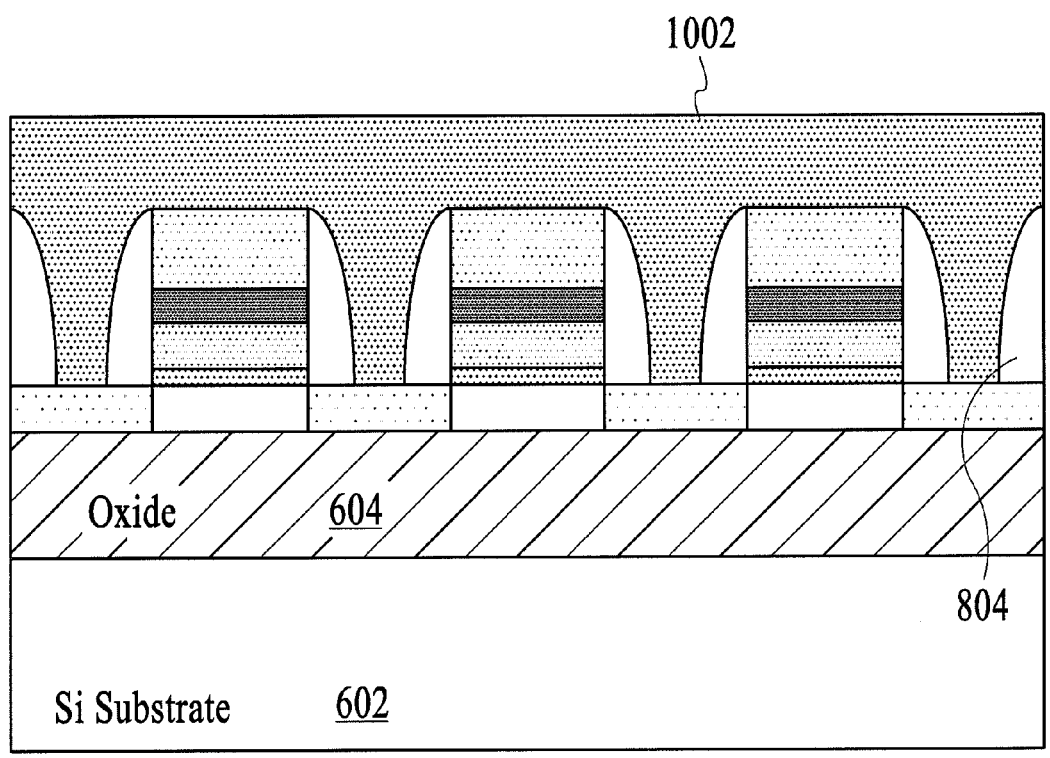
FIG. 10 is a side view illustration of a memory array after deposition of conductive material in the trench area formed by spacers, under an embodiment.

FIG. 9 is a side view illustration of a memory array after a trench etch process, under an embodiment. As shown in FIG. 9, once the insulator/dielectric material has been etched away in step 212 of FIG. 2, the top surface 902 of the insulation layer 614 of the poly gate is exposed, and the gap area down to the active area 606 is left open. This area is then filled with deposition of a plug or conductive material, such as polysilicon, Tungsten (W), or other suitable conductive or semiconductive material. This is illustrated as block 214 of FIG. 2. FIG. 10 is a side view illustration of a memory array after deposition of conductive material in the trench area formed by spacers, under an embodiment. As shown in FIG. 10, the conductive material 1002 fills the trench material down to the source/drain areas 606 and is insulated from the poly gate area by spacer area 804 and by insulative layer 614.

Figure 11:
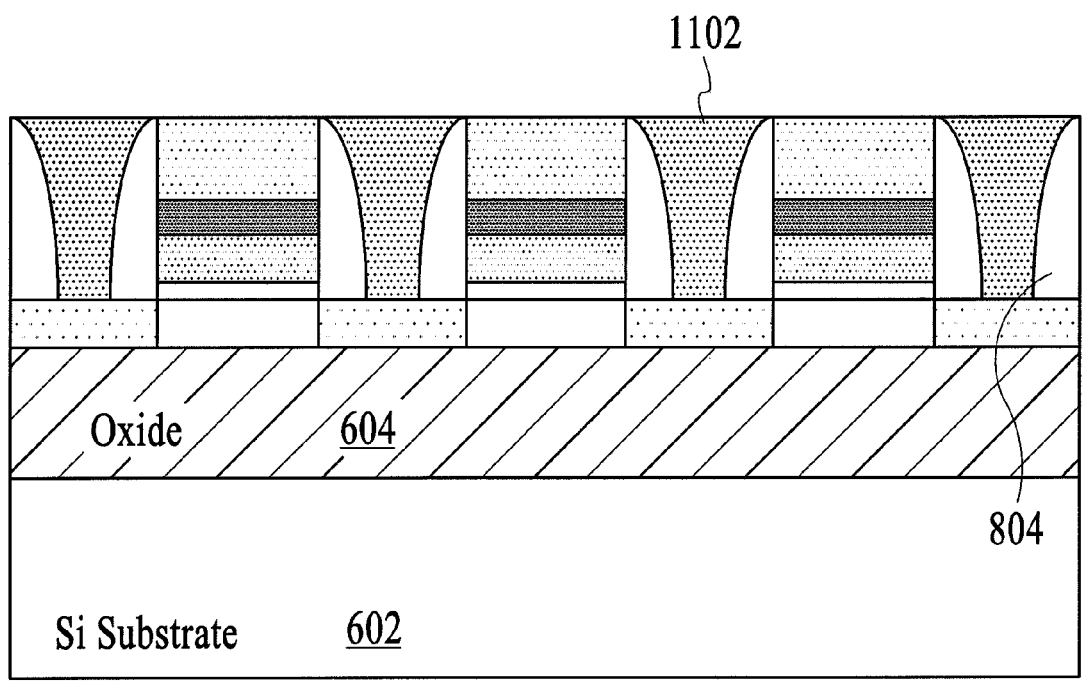
FIG. 11 illustrates a side view of a memory array after planarization of conductive material in the trench area, under an embodiment.

Once the conductive material has been deposited, it is planarized down to the nitride etch stop layer 614 by a CMP (Chemical Mechanical Planarization) or similar process. In general, CMP processes use a chemical slurry formulation and mechanical polishing to remove unwanted material and polish wafer material to a near-perfect flat and smooth surface for subsequent photolithography steps. After this planarization process, the contact (plug) material will reside only in the contact areas. FIG. 11 illustrates a side view of a memory array after planarization of conductive material in the trench area, under an embodiment. As shown in FIG. 11, the remaining conductive material 1102 forms a contact area path to the active area 606 that is flush with the top surface 902 of the insulation layer of the poly gates.

Figure 12:
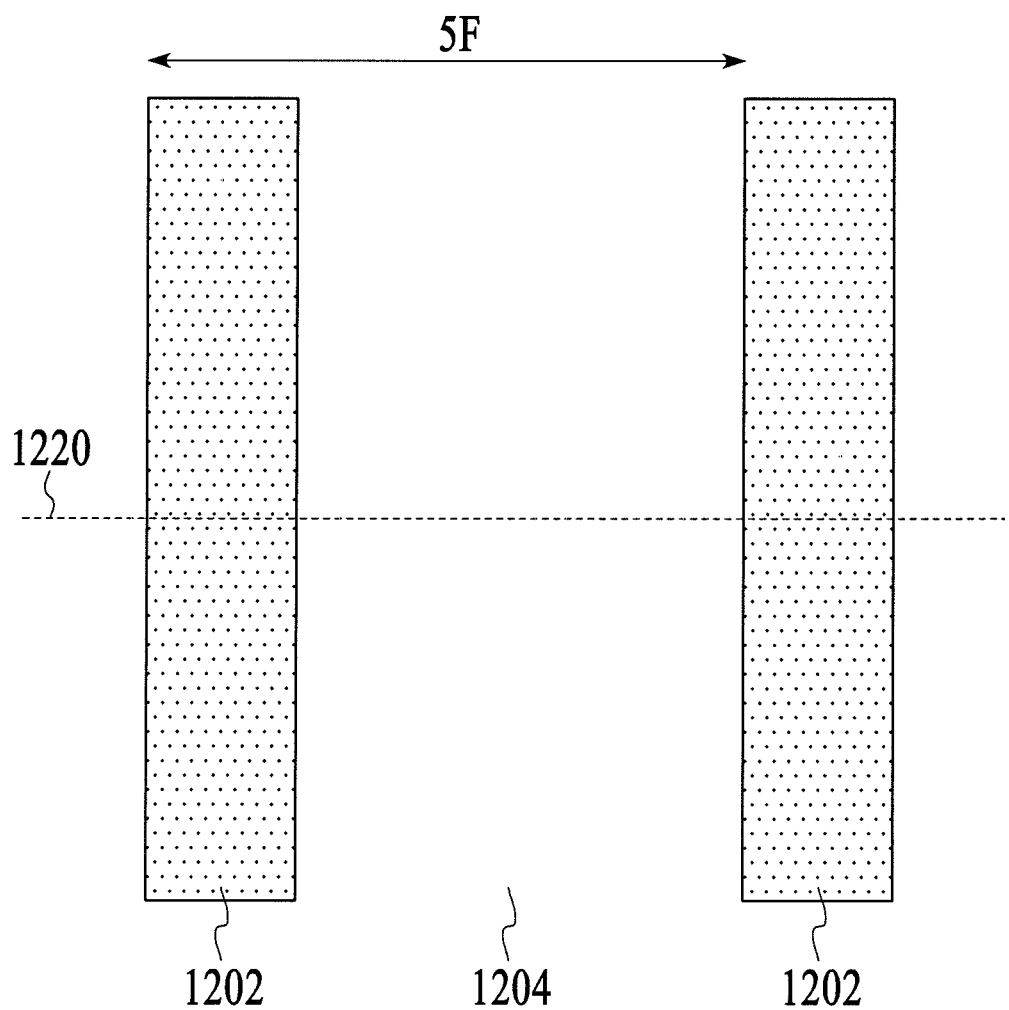
FIG. 12 is a top view of metal 1 lines formed on a memory array, under an embodiment.

Once the conductive material is deposited and planarized in the trench areas, the array is ready for metal line formation. The conductive material forms contact areas that connect the metal lines of the circuit to the active areas of the memory cells. Any number, n, of metal lines can be used, for example, present stand alone memories have up to 5 metal lines that are numbered M1 to Mn from bottom to top. Each of the metal line layers is separated by insulative material, and the metal lines are connected to one another through vias. In one embodiment, every other contact area is connected to a metal line layer, and the remaining alternating contact areas are connected to vias. As shown as block 218 of FIG. 2, straight metal 1 (M1) line patterns are formed on alternating contact areas. FIG. 12 is a top view of metal 1 lines formed on a memory array, under an embodiment. As shown in FIG. 12, M1 lines 1202 are formed as straight lines that are separated by a gap 1204. The line pitch is defined by the width of the contact areas and the poly gates. As shown in FIG. 12, the pitch under an embodiment is 5F, as is the case when the contact area is F and the poly gate width is 1.5F, as shown in FIG. 7. Though the typical pitch for M1 lines in prior art processes is on the order of 2F, the use of 5F pitch for present embodiments greatly eases constrains associated with the lithography process.

In one embodiment, the M1 lines are formed by a Damascene process. In a Damascene process, a dielectric layer of "low-k" materials is deposited using chemical vapor or physical vapor deposition. A lithography step and etch step are then performed to create grooves to lower levels as well as to trenches where the copper or other conductive material will end up. A strong barrier layer is used to prevent migration of the copper. The metal layer is deposited through vapor deposition, and this layer serves as a seed layer for an electroplating step. This layer is then polished through a CMP step to produce a top surface that is ready for the deposition of the next layer of insulation. Other techniques, such as traditional etching processes can be used to form the metal layers, under alternative embodiments of the memory array fabrication process.

Figure 13:
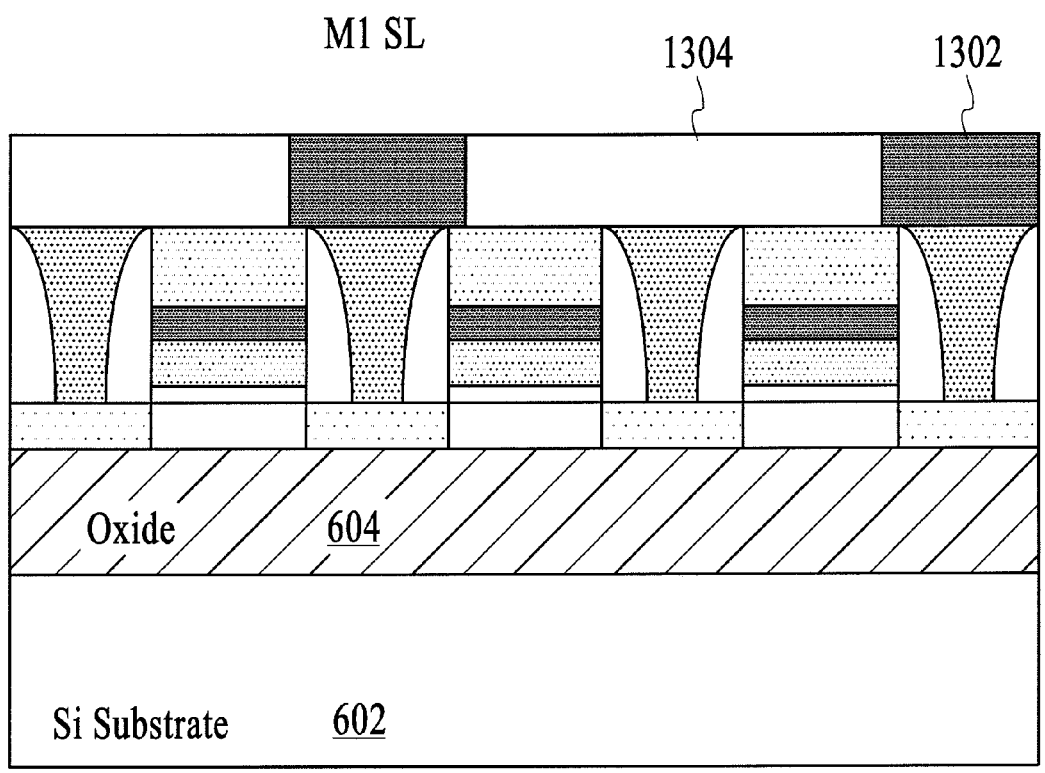
FIG. 13 is a side-view of a memory array with the metal 1 lines of FIG. 12, under an embodiment.

FIG. 13 is a side-view of a memory array with the metal 1 lines of FIG. 12, under an embodiment. The side-view of FIG. 13 represents the cross-section as viewed along cross-section line 1220 of FIG. 12. As shown in FIG. 13, the M1 lines 1302 are formed on the top surface of every other contact plug 1102 and are separated by a gap 1304 that consists of the width of an intermediate contact plug and two poly gates. In one embodiment, the M1 lines represent source lines (SL) that contact active areas 606 that represent the source regions of respective transistors. For purposes of illustration, the source lines run perpendicular to the plane of the drawing shown in FIG. 13.

Figure 14:
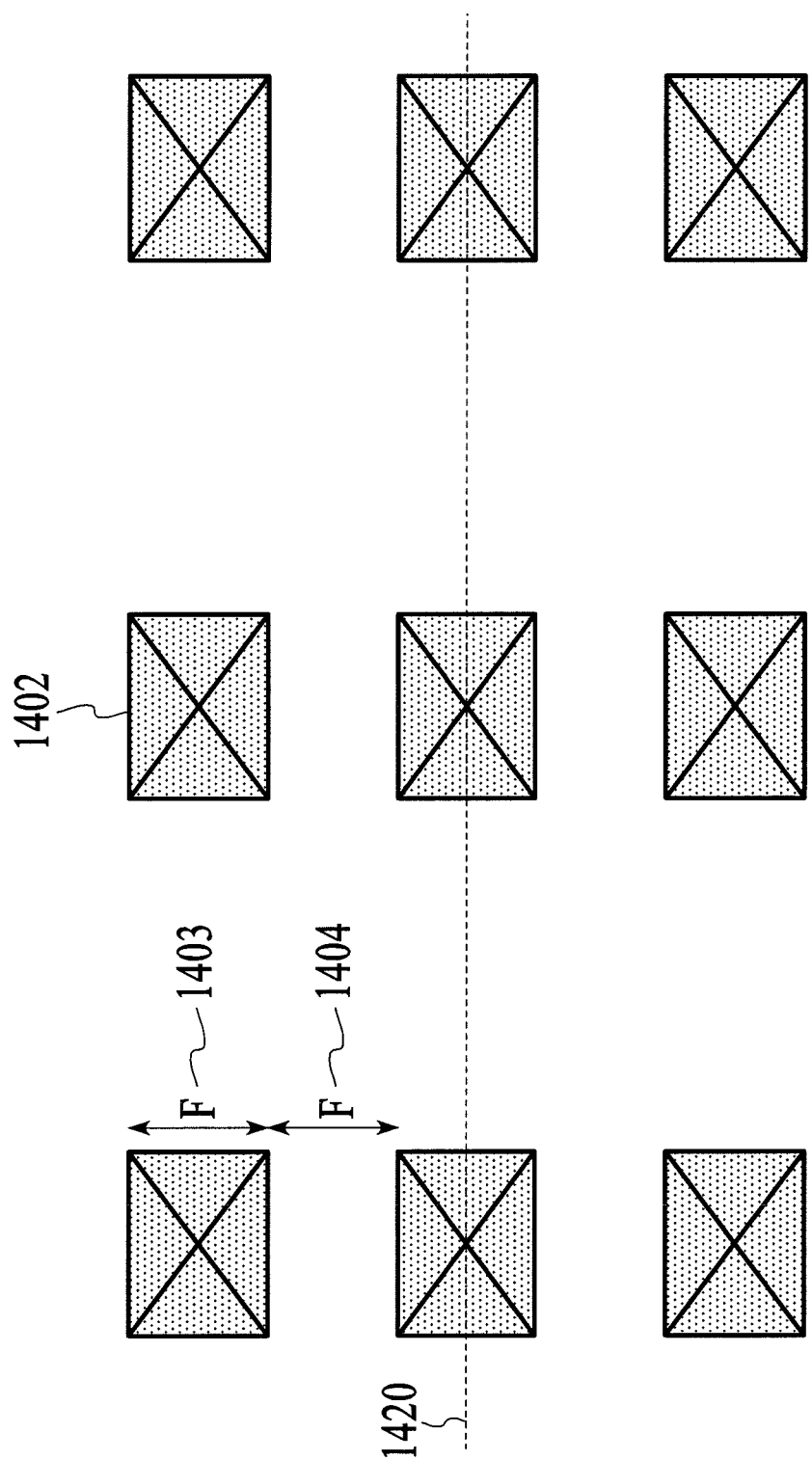
FIG. 14 illustrates the formation of via patterns on a memory array, under an embodiment.

In one embodiment, the remaining alternating contact areas in between the M1 lines are dedicated to vias. Thus, as shown in block 220 of FIG. 1, vias are formed on alternating contact areas between the M1 lines. FIG. 14 illustrates the formation of via patterns on a memory array, under an embodiment. A number of vias 1402 of dimension F by 1.5F are patterned in a rectangular array. The minimum pitch between the vias is 2F as defined by the critical width of the via 1403 and the minimum spacing 1404 between the vias 1402. As shown in FIG. 14, the vias are formed with elongated shapes, as opposed to square or round cross-sections, in order to ease lithographic constraints, and in one embodiment, the vias are overetched down to the contact surface.

Figure 15:
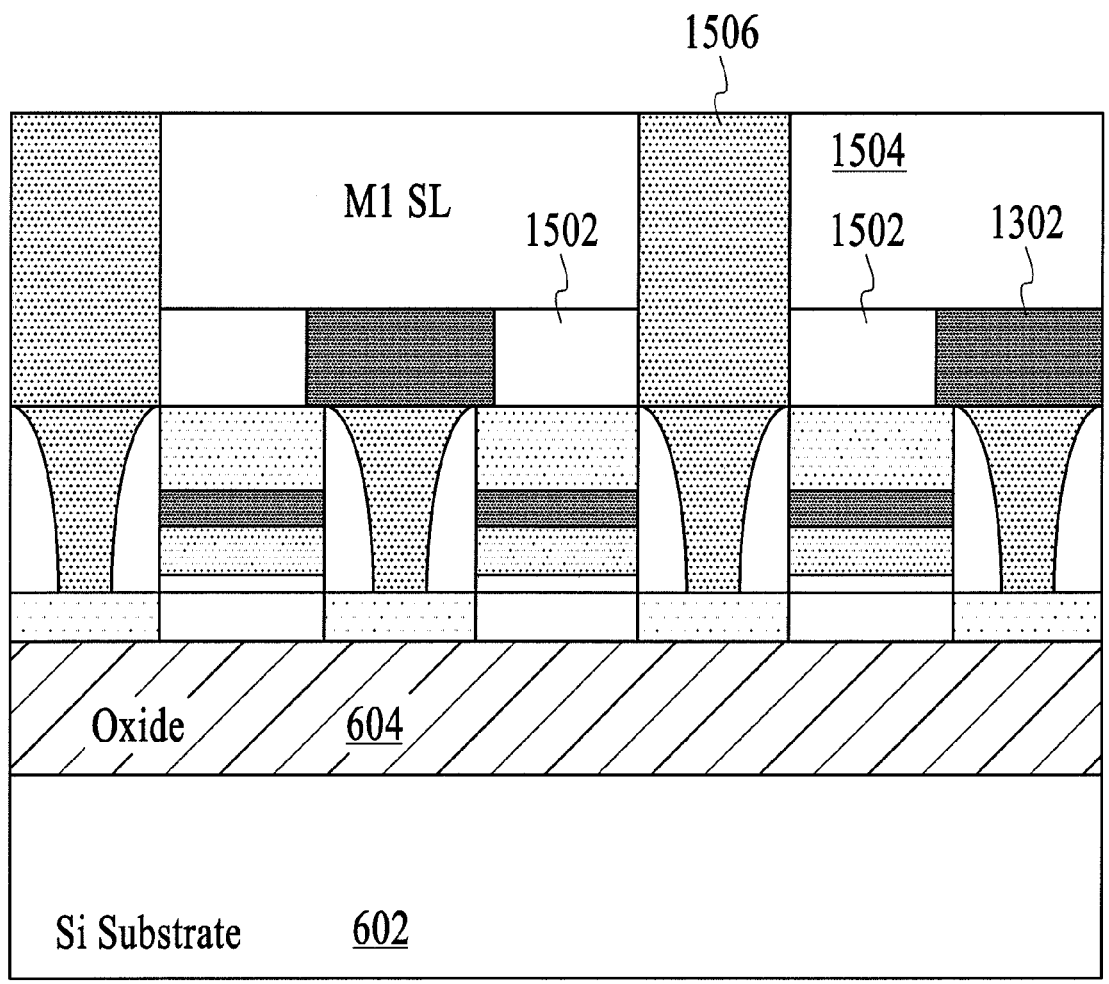
FIG. 15 is a side-view of a memory array with the vias of FIG. 14 under an embodiment.

FIG. 15 is a side-view of a memory array with the vias of FIG. 14 under an embodiment. The side-view of FIG. 15 represents the cross-section as viewed along cross-section line 1420 of FIG. 14. As shown in FIG. 15, the vias 1506 are formed on the top surface of every other contact plug 1102 and are separated from neighboring M1 lines 1302 by gaps 1502 that consist of the poly gates. The vias comprise connections between any two or more metal layers of the memory array, or between a metal line and the drain areas of respective transistors.

Figure 16:
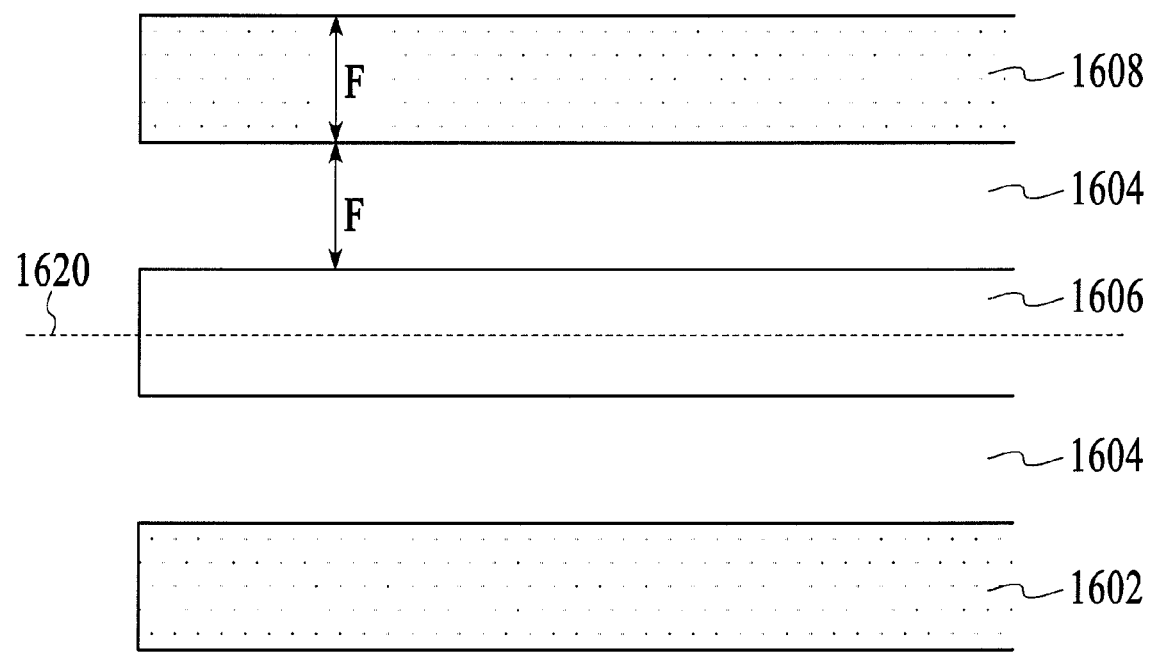
FIG. 16 is a top view of metal 2 (M2) lines formed on a memory array, under an embodiment.

Subsequent metal line layers (M2 and above), as well as vias can be produced in subsequent process steps that employ straight line formation of conductive lines. FIG. 16 is a top view of metal 2 (M2) lines formed on a memory array, under an embodiment. As shown in FIG. 16, M2 lines 1602, 1606, and 1608 are formed as straight lines that are separated by gaps 1604. The line pitch between the M2 lines can be defined by the critical width, F, of the poly gates, thus producing a line pitch of 2F, as shown in FIG. 16.

Figure 17:
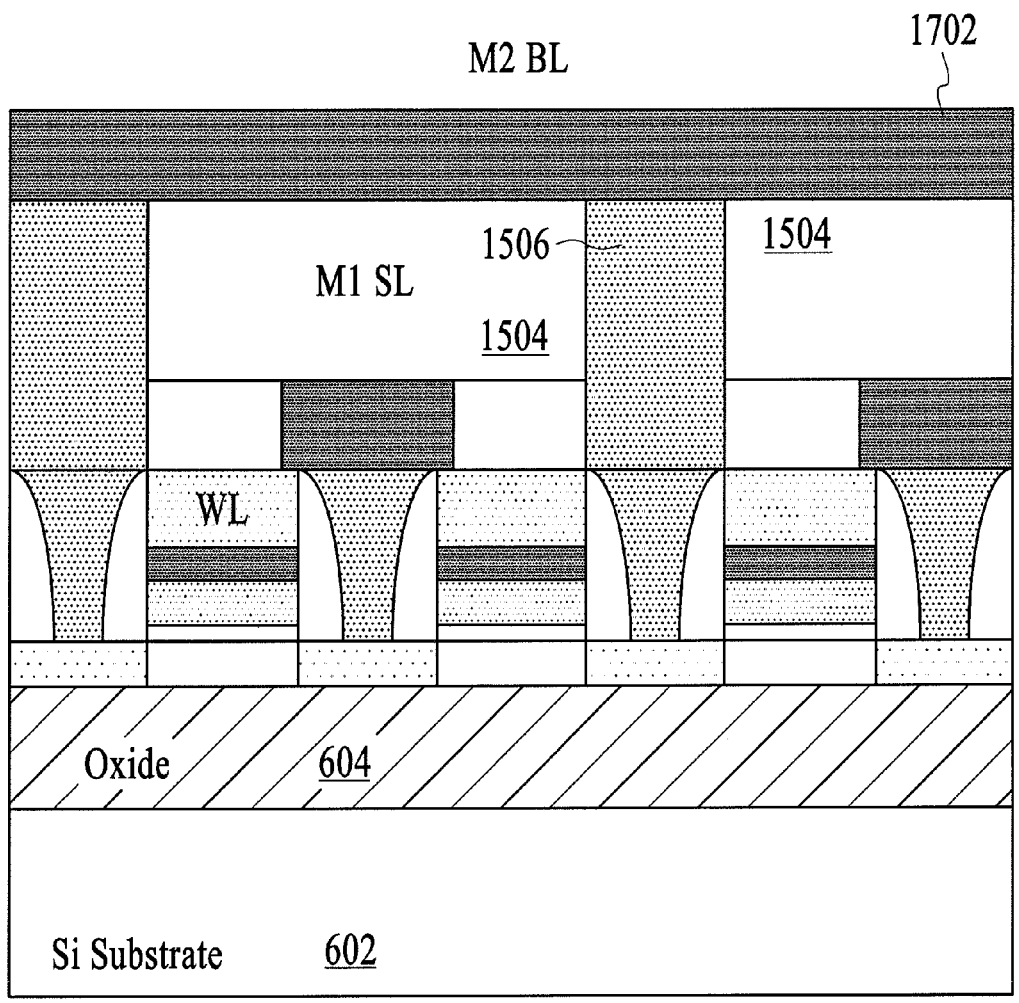
FIG. 17 is a side-view of a memory array with the metal 2 lines of FIG. 16, under an embodiment.

FIG. 17 is a side-view of a memory array with the metal 2 lines of FIG. 16, under an embodiment. The side-view of FIG. 17 represents the cross-section as viewed along cross-section line 1620 of FIG. 16. As shown in FIG. 17, the M2 line 1702 is formed on the top surface of one or more via contact areas 1506 and on top of an insulative surface 1504 separating the M2 lines from the M1 lines 1302. This process is illustrated as block 222 of FIG. 2. In one embodiment, the M2 lines represent bit lines (BL) that run perpendicular to the M1 source lines, and the word lines (WL) that can be formed from other metal line layers. For purposes of illustration, the bit lines run parallel to the plane of the drawing shown in FIG. 17. Any additional metal line layers (M3 to Mn) can be formed by additional Damascene line deposition processes, as illustrated in block 224 of FIG. 2. Such additional metal lines can be used to connect to other peripheral devices or components, and can be arranged such that alternate additional metal layers can be arranged perpendicular to one another, such as shown for the M1 and M2 layers in FIG. 17.

Figure 18:
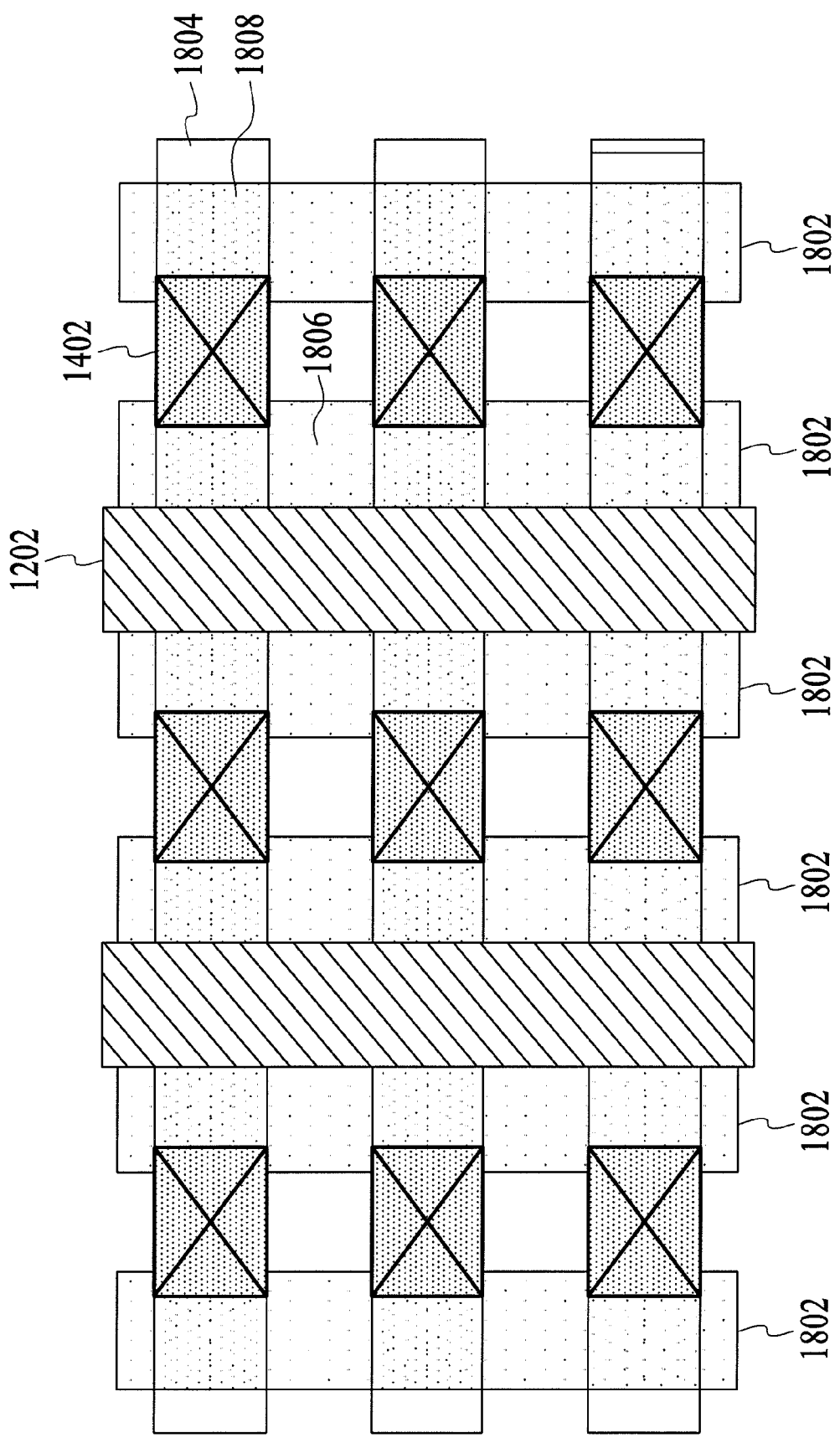
FIG. 18 is a top view of a memory array comprising M1 lines, M2 lines, and vias, under an embodiment.

FIG. 18 is a top view of a memory array comprising M1 lines, M2 lines, and vias, under an embodiment. As shown in FIG. 18, the M1 lines 1202 representing source lines are patterned between vias 1402. The M2 lines 1804 are laid on top of the active areas 302 of FIG. 3 and represent bit lines that run perpendicular to the source M1 lines. The poly line areas 1806 represent ground or write lines. A bit cell for a memory device generally comprises the intersection of an M1 line and an M2 line and a portion of the area 1808 around the intersection. The contact areas 708 shown in FIG. 7 reside underneath the vias 1402 and the M1/M2 intersections of FIG. 18.

For the memory array embodiment of FIG. 18, the pitch of the M2 lines is generally 2F, while the pitch of the M1 lines is generally 5F. The metal lines are advantageously laid in straight lines, thus optimizing the lithography process and eliminating the need for curved or bent contact lines, as shown in FIG. 1B. Various other constraints associated with present manufacturing processes are also optimized, such as the elimination of M1 islands and the relaxation of dimensions associated with at least the M1 lines, contact areas, and vias. The dimensions of the bit cells can be $5F^2$ with an active area of 2F pitch and 2.5F poly pitch. The bit cell dimension can be reduced to $4F^2$ if a poly gate of width 1F is used.

Embodiments of the memory array manufacturing process can be applied to various types of array arrangements. At least one embodiment described herein has been directed to arrays in which the drain junction of a bit cell is shared with a neighboring cell and the source junction of a bit cell is shared with a second neighboring cell, and such an embodiment may be referred to as a common drain-common source cell layout. However, embodiments of the described process can also be applied to other array arrangements. In one alternative embodiment, neither the source nor drain junction of a bit cell is shared with a neighboring cell (separated drain-separated source cell layout). In a further alternative embodiment, only the source junction is shared between two neighboring cells, and not the drain (common source-separated drain cell layout). In yet a further alternative embodiment, only the drain junction is shared between two neighboring cells, and not the source (common drain-separated source cell layout).

Aspects of the manufacturing process and process flow described herein may executed by a computer executing program instructions, or as functionality programmed into any of a variety of circuitry for semiconductor processing programs or equipment. Such programs and equipment can be embodied in various different circuits, components, or systems, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects of the semiconductor manufacturing system include: microcontrollers with memory (such as EEPROM), embedded microprocessors, firmware, software, etc. Furthermore, aspects of the described method may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and any present claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the semiconductor manufacturing process and system is not intended to be exhaustive or to limit the embodiments to the precise form or instructions disclosed. While specific embodiments of, and examples are described herein for illustrative purposes, various equivalent modifications are possible within the scope of the described embodiments, as those skilled in the relevant art will recognize.

The elements and acts of the various embodiments described above can be combined to provide further embodiments. These and other changes can be made to the semiconductor manufacturing process in light of the above detailed description.

In general, in the following, the terms used should not be construed to limit the described system to the specific embodiments disclosed in the specification, but should be construed to include all operations or processes that operate thereunder.

While certain aspects of the disclosed method and system may be presented below in certain forms, the inventor contemplates the various aspects of the methodology in any number of forms. For example, while only one aspect of the describe process may be recited as embodied in machine-readable medium, other aspects may likewise be embodied in machine-readable medium.

Aspects of the embodiments described herein may include a method of fabricating semiconductor memory cells comprising: forming a plurality of parallel active area lines in a first direction on a substrate, each active area line of the plurality having a first predefined width and separated from a neighboring active area line by a first predefined gap; forming a plurality of parallel word lines in a second direction perpendicular to the first direction on the substrate, each word line of the plurality having a first predefined width and separated from a neighboring word line by a second predefined gap; defining the intersections of the active area lines and word lines to be active areas for gate, source and drain regions of each of a plurality of transistors formed by the active area lines and word lines; and layering polycide and insulative regions on the word lines. The substrate comprises a Silicon-on-Insulator substrate consisting of an oxide layer formed on a silicon substrate, the oxide layer covered by a doped silicon layer, and wherein the active area lines comprise substantially elongated rectangular areas. The method further comprises forming an insulative spacer region on either side of each gate region defined by the intersection areas of the word lines, the insulative spacer region defining a trench running parallel and in between the word lines, and proximate an upper surface of the source and drain regions of the plurality of transistors. The insulative spacer region consists of an insulative material that is identical to the material layered on the conductive region of the gate regions of each of the transistors. The insulative material is selected from the group consisting of: $Si_3N_4$, $Ta_2O_5$, $TiO_2$, $ZrO_2$, $HfO_2$, and $Al_2O_3$.

The method further comprising depositing a dielectric material in the trench defined by the spacer region; etching the trench to the source and drain areas, wherein the insulative material of the spacer region acts as an etch stop; depositing a conductive material in the etched region of the trench; and planarizing the conductive material such that a top surface of the conductive material is flush with a top surface of the insulative region of the gate regions. The dielectric material comprises $SiO_2$, and the conductive material comprises Tungsten. The method further comprises: forming a pattern of parallel straight first layer metal lines on alternate contact areas defined by the deposited conductive material; depositing a layer of insulative material over the first layer metal lines; depositing the conductive material in alternate contact areas not proximate the first layer metal lines, to form vias; and forming a pattern of parallel straight second layer metal lines perpendicular to the first layer metal lines, and in contact with at least one or more of the vias. The first layer metal lines comprise source lines for the transistors, and wherein the second layer metal lines comprise bit lines for the transistors, and the word lines comprise word lines for the transistors. The first pre-defined width is equal to the second pre-defined width, and corresponds to a feature size F of each transistor of the plurality of transistors. The first pre-defined width corresponds to a feature size F of each transistor of the plurality of transistors, and the second pre-defined width is larger than the first pre-defined width. The second pre-defined width may be in the range of 1.1F to 3F.

Embodiments may also include a method of manufacturing a plurality of memory cells on a substrate, comprising forming a substantially rectangular array of transistor gates through the deposition of parallel word lines on the substrate, the word lines separated by a first distance; forming a substantially rectangular array of contact areas on opposing sides of each transistor gate of the transistor gates through the formation of active area lines on the substrate in a direction perpendicular to the word lines, the active area lines separated by a second distance, wherein a first contact area corresponding to a source region of the transistor, and a second contact area corresponding to a drain region of the transistor; forming a parallel array of first metal lines connecting a first set of contact areas of the rectangular array of contact areas; and forming an array of vias corresponding to a second set of contact areas of the rectangular array of contact areas. The method further comprising: depositing an insulative layer over the array of first metal lines; and forming a parallel array of second metal lines connected to at least a portion of the vias, wherein the array of second metal lines is perpendicular to the array of first metal lines. The first layer metal lines comprise source lines for the transistors, and wherein the second layer metal lines comprise bit lines for the transistors, and further wherein the word lines comprise write lines for the transistors. The transistor gates are formed by depositing a polycide layer on the word lines, and depositing an insulative layer on the polycide layer.

The contact areas are formed by: defining an insulative spacer region on opposing sides of the transistor gate, the insulative spacer region defining a trench disposed between pairs of word lines; depositing a dielectric material in the trench defined by the spacer region; etching the trench to the source and drain areas, wherein the insulative material of the spacer region acts as an etch stop; depositing a conductive material in the etched region of the trench; and planarizing the conductive material such that a top surface of the conductive material is flush with a top surface of the insulative region of the poly gates. The substrate of this method comprises a Silicon-on-Insulator substrate consisting of an oxide layer formed on a silicon substrate, the oxide layer covered by a doped silicon layer.

Embodiments may also include a semiconductor processing system for producing an array of memory cells, the system comprising: a first circuit forming a plurality of parallel active area lines in a first direction on a substrate, each active area line of the plurality having a first predefined width and separated from a neighboring active area line by a first predefined gap; a second circuit forming a plurality of parallel word lines in a second direction perpendicular to the first direction on the substrate, each poly line of the plurality having a first predefined width and separated from a neighboring poly area line by a second predefined gap, wherein the intersections of the active area lines and word lines define active areas for gate, source and drain regions of each of a plurality of transistors formed by the active area lines and word lines; and a third circuit layering polycide and insulative regions on the word lines. The substrate comprises a Silicon-on-Insulator substrate consisting of an oxide layer formed on a silicon substrate, the oxide layer covered by a doped silicon layer. The system further comprises a circuit forming an insulative spacer region on either side of each gate region defined by the non-intersection areas of the word lines, the insulative spacer region defining a trench running parallel and in between the word lines, and proximate an upper surface of the source and drain regions of the plurality of transistors. The insulative spacer region consists of an insulative material that is identical to the material layered on the conductive region of the poly gate regions of each of the transistors, and wherein the insulative material is selected from the group consisting of: $Si_3N_4$, $Ta_2O_5$, $TiO_2$, $ZrO_2$, $HfO_2$, and $Al_2O_3$.

The system further comprises a first lithography subsystem configured to: deposit a dielectric material in the trench defined by the spacer region; etch the trench to the source and drain areas, wherein the insulative material of the spacer region acts as an etch stop; deposit a conductive material in the etched region of the trench; and planarize the conductive material such that a top surface of the conductive material is flush with a top surface of the insulative region of the gate region. The dielectric material comprises $SiO_2$, and the conductive material comprising Tungsten.

The system further comprises a second lithography subsystem configured to: form a pattern of parallel straight first layer metal lines on alternate contact areas defined by the deposited conductive material; deposit a layer of insulative material over the first layer metal lines; deposit the conductive material in alternate contact areas not proximate the first layer metal lines, to form vias; and form a pattern of parallel straight second layer metal lines perpendicular to the first layer metal lines, and in contact with at least one or more of the vias. The first layer metal lines and the second layer metal lines are formed through a Damascene process. The second lithography subsystem is configured to deposit additional insulative layers and subsequent layer metal lines in successive subsequent Damascene process steps.

Embodiments may further include an array of memory cells, comprising: a substantially rectangular array of transistor gates formed through the deposition of parallel word lines on the substrate, the word lines separated by a first distance; a substantially rectangular array of contact areas on opposing sides of each transistor gate of the transistor gates formed through the formation of active area lines on the substrate in a direction perpendicular to the word lines, the active area lines separated by a second distance, wherein a first contact area corresponding to a source region of the transistor, and a second contact area corresponding to a drain region of the transistor; a parallel array of first metal lines connecting a first set of contact areas of the rectangular array of contact areas; and an array of vias corresponding to a second set of contact areas of the rectangular array of contact areas. The array comprises a parallel array of second metal lines connected to at least a portion of the vias, wherein the array of second metal lines is perpendicular to the array of first metal lines and formed over an insulative layer deposited over the array of first metal lines. The first layer metal lines comprise source lines for the transistors, and wherein the second layer metal lines comprise bit lines for the transistors, and further wherein the word lines comprise word lines for the transistors. The transistor gates are formed by depositing a polycide layer on the word lines, and depositing an insulative layer on the polycide layer.

The contact areas are formed by a computer-controlled fabrication process executing instructions operable to: define an insulative spacer region on opposing sides of the transistor gate, the insulative spacer region defining a trench disposed between pairs of word lines; deposit a dielectric material in the trench defined by the spacer region; etch the trench to the source and drain areas, wherein the insulative material of the spacer region acts as an etch stop; deposit a conductive material in the etched region of the trench; and planarize the conductive material such that a top surface of the conductive material is flush with a top surface of the insulative region of the poly gates. The substrate comprises a Silicon-on-Insulator substrate consisting of an oxide layer formed on a silicon substrate, the oxide layer covered by a doped silicon layer. The array has a dimension of each bit cell of the array defined by the feature size, F, of the active area, and corresponds to $4F^2$. The array may further have a dimension of each bit cell of the array defined by a first multiple of the feature size, F, of the active area, and corresponds to a size of at least $5F^2$. The array comprises an array of dynamic random access memory cells, and wherein the dynamic random access memory cells may comprise Z-RAM cells, and wherein the memory cells may comprise standalone memory cells.

What is claimed is:

1. A method of fabricating semiconductor memory cells comprising:
   forming a plurality of substantially parallel doped semiconductor active area lines in a first direction on and substantially parallel to a surface of a substrate, each active area line of the plurality having a first predefined width and separated from a neighboring active area line by a first predefined gap;
   forming a plurality of substantially parallel word lines in a second direction substantially perpendicular to the first direction above and substantially parallel to the surface of the substrate, each word line of the plurality having a second predefined width and separated from a neighboring word line by a second predefined gap;
   defining active areas in the active area lines for gate, source, and drain regions of each of a plurality of transistors formed by the active area lines and the word lines, wherein the active areas for gate regions are formed at spatially separated intersections of the active area lines and the word lines, wherein the active areas for source and drain regions are formed at spatially separated intersections of the active area lines and the second predefined gaps between neighboring word lines to provide substantially square contact areas for the active areas for source and drain regions, wherein the active areas for gate regions form channel regions in the active area lines, and wherein the active areas for gate regions are separated from respective word lines by insulative regions the thicknesses of which may be adjusted to optimize operation of the memory cells; and
   layering polycide and insulative regions on the word lines.

2. The method of claim 1 wherein the substrate comprises a Silicon-on-Insulator substrate consisting of an oxide layer formed on a silicon substrate, the oxide layer covered by a doped silicon layer, and wherein the active area lines comprise substantially elongated rectangular areas.

3. The method of claim 1 further comprising forming an insulative spacer region on either side of each gate region defined by the intersections of the active area lines and word lines, the insulative spacer region defining a trench running substantially parallel and in between the word lines, and proximate an upper surface of the source and drain regions of the plurality of transistors.

4. The method of claim 3 wherein the insulative spacer region consists of an insulative material that is identical to material layered on a conductive region of the gate regions of each of the transistors.

5. The method of claim 4 wherein the insulative material is selected from the group consisting of: $Si_3N_4$, $Ta_2O_5$, $TiO_2$, $ZrO_2$, $HfO_2$, and $Al_2O_3$.

6. The method of claim 5 further comprising:
   depositing a dielectric material in the trench defined by the spacer region;
   etching the trench to the source and drain areas, wherein the insulative material of the spacer region acts as an etch stop;
   depositing a conductive material in the etched region of the trench; and
   planarizing the conductive material such that a top surface of the conductive material is flush with a top surface of the insulative region of the gate regions.

7. The method of claim 6 wherein the dielectric material comprises $SiO_2$, and the conductive material comprises Tungsten.

8. The method of claim 7 further comprising:
   forming a pattern of substantially parallel straight first layer metal lines on alternate contact areas defined by the deposited conductive material;
   depositing a layer of insulative material over the first layer metal lines;
   depositing the conductive material in alternate contact areas not proximate the first layer metal lines, to form vias; and
   forming a pattern of substantially parallel straight second layer metal lines substantially perpendicular to the first layer metal lines, and in contact with at least one or more of the vias.

9. The method of claim 8 wherein the first layer metal lines comprise source lines for the transistors, and wherein the second layer metal lines comprise bit lines for the transistors, and the word lines comprise word lines for the transistors.

10. The method of claim 9 wherein the first pre-defined width is equal to the second pre-defined width, and corresponds to a feature size F of each transistor of the plurality of transistors.

11. The method of claim 10 wherein the first pre-defined width corresponds to a feature size F of each transistor of the plurality of transistors, and the second pre-defined width is larger than the first pre-defined width.

12. The method of claim 11 wherein the second pre-defined width may be in the range of 1.1F to 3F.

13. A method of manufacturing a plurality of memory cells on a substrate, the method comprising:
forming an array of transistor gates through the deposition of substantially parallel word lines above and substantially parallel to a surface of the substrate, the word lines separated by a first distance;
forming an array of substantially square contact areas through the formation of doped semiconductor active area lines on and substantially parallel to the surface of the substrate in a direction substantially perpendicular to the word lines such that active areas are formed in the active area lines for gate, source, and drain regions of each of a plurality of transistors formed by the active area lines and the word lines, the active area lines separated by a second distance, wherein first substantially square contact areas corresponding to source regions of the transistors and second substantially square contact areas corresponding to drain regions of the transistors are formed on opposing sides of each transistor gate of the transistor gates, wherein the active areas for gate regions are formed at spatially separated intersections of the active area lines and the word lines, wherein the active areas for source and drain regions are formed at spatially separated intersections of the active area lines and gaps of the first distance between neighboring word lines, wherein the active areas for gate regions form channel regions in the active area lines, and wherein the active areas for gate regions are separated from respective word lines by insulative regions the thicknesses of which may be adjusted to optimize operation of the memory cells;
forming a substantially parallel array of first metal lines connecting a first set of substantially square contact areas of the array of substantially square contact areas; and
forming an array of vias corresponding to a second set of substantially square contact areas of the array of substantially square contact areas.

14. The method of claim 13 further comprising:
depositing an insulative layer over the array of first metal lines; and
forming a substantially parallel array of second metal lines connected to at least a portion of the vias, wherein the array of second metal lines is substantially perpendicular to the array of first metal lines.

15. The method of claim 14 wherein the first layer metal lines comprise source lines for the transistors, and wherein the second layer metal lines comprise bit lines for the transistors, and further wherein the word lines comprise write lines for the transistors.

16. The method of claim 15 wherein the transistor gates are formed by depositing a polycide layer on the word lines, and depositing an insulative layer on the polycide layer.

17. The method of claim 16 wherein the substantially square contact areas are formed by:
defining an insulative spacer region on opposing sides of the transistor gate, the insulative spacer region defining a trench disposed between pairs of word lines;
depositing a dielectric material in the trench defined by the spacer region;
etching the trench to the source and drain areas, wherein the insulative material of the spacer region acts as an etch stop;
depositing a conductive material in the etched region of the trench; and
planarizing the conductive material such that a top surface of the conductive material is flush with a top surface of the insulative region of the poly gates.

18. The method of claim 17 wherein the substrate comprises a Silicon-on-Insulator substrate consisting of an oxide layer formed on a silicon substrate, the oxide layer covered by a doped silicon layer.

19. A method of fabricating an array of semiconductor memory cells comprising:
forming a plurality of substantially parallel doped semiconductor active area lines in a first direction on and substantially parallel to a surface of a substrate, each active area line of the plurality having a first predefined width and separated from a neighboring active area line by a first predefined gap;
forming a plurality of substantially parallel circuit lines in a second direction substantially perpendicular to the first direction above and substantially parallel to the surface of the substrate, each circuit line of the plurality having a second predefined width and separated from a neighboring circuit line by a second predefined gap;
defining active areas in the active area lines for gate, source, and drain junctions of each of a plurality of transistors formed by the active area lines and the circuit lines, wherein the active areas for gate junctions are formed at spatially separated intersections of the active area lines and the circuit lines, wherein the active areas for source and drain junctions are formed at spatially separated intersections of the active area lines and the second predefined gaps between neighboring circuit lines to provide substantially square contact areas for the active areas for source and drain junctions, wherein the active areas for gate junctions form channel regions in the active area lines, and wherein the active areas for gate junctions are separated from respective circuit lines by insulative regions the thicknesses of which may be adjusted to optimize operation of the memory cells;
defining shared junction areas between pairs of memory cells in the array; and
layering polycide and insulative regions on the circuit lines.

20. The method of claim 19 wherein the shared junction areas comprise shared drain and source junctions between adjacent pairs of memory cells.

21. The method of claim 20 wherein the shared junction areas comprise shared drain junctions between adjacent pairs of memory cells.

22. The method of claim 21 wherein the shared junction areas comprise shared source junctions between adjacent pairs of memory cells.

* * * * *